United States Patent [19]

Lohaus et al.

[11] Patent Number: 5,229,254

[45] Date of Patent: Jul. 20, 1993

[54] POSITIVE-WORKING RADIATION-SENSITIVE MIXTURES, AND RADIATION-SENSITIVE RECORDING MATERIALS PRODUCED WITH THESE MIXTURES

[75] Inventors: Gerhard Lohaus, Kelkheim; Walter Spiess, Dieburg; Georg Pawlowski, Wiesbaden, all of Fed. Rep. of Germany

[73] Assignee: Hoechst Aktiengesellschaft, Frankfurt am Main, Fed. Rep. of Germany

[21] Appl. No.: 871,027

[22] Filed: Apr. 20, 1992

[30] Foreign Application Priority Data

Apr. 20, 1991 [DE] Fed. Rep. of Germany ....... 4112966

[51] Int. Cl.$^5$ ........................ G03F 7/039; G03F 7/30
[52] U.S. Cl. .................... 430/281; 430/270; 430/326; 522/50
[58] Field of Search ............. 430/270, 281, 280, 325, 430/326; 522/50

[56] References Cited

U.S. PATENT DOCUMENTS

| | | | |
|---|---|---|---|
| 3,697,274 | 10/1972 | Herrmann | 430/270 X |
| 3,779,778 | 12/1973 | Smith et al. | 96/115 |
| 4,376,818 | 3/1983 | Ohashi et al. | 430/623 |
| 4,425,424 | 1/1984 | Altland et al. | 430/270 |
| 4,840,867 | 6/1989 | Elsaesser et al. | 430/156 |

FOREIGN PATENT DOCUMENTS

| | | |
|---|---|---|
| 0329610 | 8/1989 | European Pat. Off. . |
| 0388343 | 9/1990 | European Pat. Off. . |
| 0417556 | 3/1991 | European Pat. Off. . |
| 3930086 | 3/1991 | Fed. Rep. of Germany . |
| 3930087 | 3/1991 | Fed. Rep. of Germany . |

OTHER PUBLICATIONS

Crivello, "Possibilities for Photoimaging Using Onium Salts", *Polymer Engineering and Science Mid–Dec.*, 1983, vol. 23, pp. 953-956.

Houlihan, "An Evaluation of Nitrobenzyl Ester Chemistry for Chemical Amplification Resists", *SPIE* vol. 920 *Advances in Resist Technology and Processing*, 1988, pp. 67-73.

Willson, "Organic Resist Material—Theory and Chemistry", *Introduction To Microlithography*, 1983, pp. 89-159.

Ueno, "Chemical Amplification Positive Resist Systems Using Novel Sulfonates as Acid Generators", *Polymers For Microelectronics*, pp. 66-67.

*Primary Examiner*—Cynthia Hamilton
*Attorney, Agent, or Firm*—Foley & Lardner

[57] ABSTRACT

A positive-working radiation-sensitive mixture containing a) a compound which generates a strong acid under the action of actinic radiation,
b) a compound having at least one C-O-C or C-O-Si bond cleavable by acid and
c) a polymeric binder which is insoluble in water and soluble or at least swellable in aqueous alkaline solutions, wherein the compound a) is a 1-sulfonyloxy-2-pyridone, is useful in the preparation of positive-working recording materials.

20 Claims, No Drawings

POSITIVE-WORKING RADIATION-SENSITIVE MIXTURES, AND RADIATION-SENSITIVE RECORDING MATERIALS PRODUCED WITH THESE MIXTURES

BACKGROUND OF THE INVENTION

1. Field of the Invention

The invention relates to a positive-working radiation-sensitive mixture containing a) a compound which generates a strong acid under the action of actinic radiation, b) a compound having at least one C—O—C or C—O—Si bond cleavable by acid and c) a polymeric binder which is insoluble in water and soluble or at least swellable in aqueous alkaline solutions.

The invention also relates to a radiation-sensitive recording material which has been produced with this mixture and which is suitable for producing photoresists, electronic components, printing plates or for chemical milling.

2. Description of Related Art

To produce microelectronic circuits, several lithographic techniques are currently being used. Using g-line lithography (436 nm), which is usually applied to conventional diazonaphthoquinone/novolak formulations, resist images with a resolution of down to 0.8 µm can be produced. Images of even finer structures (down to 0.5 µm) on a resist layer can be obtained by means of i-line lithography (365 nm). More recent modifications of i-line lithography, such as, for example, phase-shifting mask technology, allow a further reduction in the size of the structures of which images are to be formed, down to about 0.35 µm or less. An even higher resolution can be achieved with UV2 photoresists In this case, two irradiation techniques are used: UV2 wide band exposure (240 to 260 nm) or exposure with KrF-excimer lasers which emit at 248 nm.

Further reduction in the size of the structures, for example down into the range of less than 1 µm in chip manufacture, requires modified lithographic techniques. To form images of such fine structures, radiation of a short wavelength is used, such as high-energy UV light, electron beams and X-rays. The radiation-sensitive mixture must be adapted to the short wave radiation. A compilation of the requirements to be met by the radiation-sensitive mixture is given in the article by C. G. Willson "Organic Resist Materials Theory and Chemistry" [Introduction to Microlithography, Theory, Materials, and Processing, editors L. F. Thompson, C. G. Willson, M. J. Bowden, ACS Symp. Ser., 219, 87 (1983), American Chemical Society, Washington].

There is therefore an increased demand for radiation-sensitive mixtures which can be used in the more recent technologies, such as mid-UV or deep-UV lithography [exposure, for example, with excimer lasers at wavelengths of 305 nm (XeF), 248 nm (KrF), 193 nm (ArF)], electron beam lithography or X-ray lithography, and which, furthermore, are preferably sensitive in a wide spectral region and correspondingly can also be used in conventional UV lithography.

Mixtures which, in addition to a binder which is insoluble in water and soluble or at least swellable in aqueous alkaline solutions, and a component which generates a strong acid under the action of actinic radiation, containing a compound cleavable by acid, for example having C—O—C or C—O—Si bonds, are known in principle, for example from DE-A 2,306,248 equivalent to U.S. Pat. No. 3,779,778.

Compounds which generate a strong acid on irradiation, especially onium salts, such as diazonium, phosphonium, sulfonium and iodonium salts of non-nucleophilic acids such as $HSbF_6$, $HAsF_6$ or $HpF_6$ [See J. V. Crivello, Polym. Eng. Sci., 23 (1983) 953]have hitherto been used. In addition, halogen compounds, especially trichloromethyltriazine derivatives, trichloromethyloxadiazole derivatives and o-quinonediazidesulfochlorides have been recommended.

These compounds are used in negative- or positive-working radiation-sensitive mixtures. The use of such photolytic acid generators involves, however, disadvantages which drastically restrict the possible uses thereof in various fields of application. For example, many of the onium salts are toxic. Their solubility is inadequate in many solvents, which is why only a few solvents are suitable for preparing a coating solution. Furthermore, when the onium salts are used, undesired foreign atoms are sometimes introduced which can cause interference with the process, especially in microlithography. Moreover, the onium salts form Brönstedt acids, which have a very severe corrosive action, in the photolysis. These acids attack sensitive substrates, so that the use of such mixtures leads to unsatisfactory results. As already mentioned earlier, the halogen compounds and also the quinonediazidesulfonic acid chlorides also form hydrohalic acids which have a severely corrosive action. In addition, such compounds also have only a limited storage life on certain substrates. This was improved by inserting an interlayer between the substrate and the radiation-sensitive layer containing compounds of the type (a), but this led to an undesired increase in defects and diminished reproducibility (see DE-A 3,621,376 equivalent to U.S. Pat. No. 4,840,867).

In more recent papers by F. M. Houlihan et al., SPIE 920, 67 (1988), it was shown by reference to positive-working systems that, in addition to the above-mentioned acid generators, nitrobenzyl tosylates, which on exposure generate sulfonic acids having a low migration tendency, can also be used in certain acid-unstable resist formulations. It can be deduced from these results that such compounds can also be used for photo-curable systems. The sensitivities thus achieved, especially to UV radiation from 350 to 450 nm, and the thermal stability of the photoresists, however, have proven to be inadequate.

Resist formulations with naphthoquinone-2-diazide-4-sulfonic acid esters, oximesulfonates, 1,2-disulfones, bis-sulfonyl-diazomethane (see DE-A 3,930,086) and sulfonylcarbonyl-diazomethane (see DE-A 3,930,087) have also been disclosed. Under the action of actinic radiation, all these compounds generate sulfonic acids which do not have a corrosive action. However, they frequently do not have an adequate thermal stability. Moreover, the photochemical reaction proceeds with an unsatisfactory quantum yield. The resist formulations absorb radiation of wavelength 248 nm to a considerable degree. The sensitivity to radiation of this wavelength is in the range from 50 to 100 $mJ/cm^2$. Images of structures as occur in practice, having an order of magnitude of 0.5 µm and less, cannot be formed by means of such resists.

It is also known to use 1,2,3-trihydroxybenzene fully esterified with methane-, ethane-, propane-, butane-, benzene-, toluene- or naphthalene-sulfonic acid as a photo-active acid generator in positive-working photoresist systems [see T. Ueno et al., Chemical Amplification Positive Resist Systems Using Novel Sulfonates as Acid Generators, in "Polymers for Microelectronics - Science and Technology", edited by Y. Tabata et al., KodanshaWeinheim-New York, 1989, pages 66-67]. However, these resist systems are not used in practice, since their thermal stability and plasma etching resistance are inadequate and, after development, resist remnants in the grooves and unacceptable resist profiles are observed. The sensitivity of these resist systems is restricted to the UV2 range.

In spite of the intensive research activity so far carried out in this field, no radiation-sensitive mixture is at present known from which a positive-working radiation-sensitive recording material can be prepared which has a high sensitivity in the deep UV region [DUV (200 to 300 nm)] the mid-UV region [MUV (300 to 350 nm)] and the near-UV region [NUV (350 to 450 nm)] and which has high resolution, and which, even on brief irradiation, releases a sufficient quantity of an acid which does not have a corrosive action and which is sufficiently strong for cleaving compounds of type b) and which, in addition, can also be developed in aqueous alkaline media.

SUMMARY OF THE INVENTION

It is therefore an object of the invention to provide a radiation-sensitive mixture based on acid-generating compounds in combination with compounds cleavable by acid, wherein the compound photolytically generating an acid should be as stable as possible on all known substrates and gives an acid not having a corrosive action as the photoproduct.

It is a further object of the present invention to provide a recording material which provides a defect-free image of the mask having high flank stability which is suitable for use in the production of photoresists, electronic components, and printed plates.

It is also an object of the present invention to provide a process for producing such a recording material.

It is also an object of the invention to provide a method of preparing an image pattern using such a recording material.

In accomplishing the foregoing objectives, there has been provided, in accordance with one aspect of the present invention, a positive-working radiation-sensitive mixture comprising a) at least one compound which generates a strong acid under the action of actinic radiation, b) at least one compound having at least one C—O—C or C—O—Si bond cleavable by acid, and c) at least one polymeric binder which is insoluble in water and soluble or at least swellable in aqueous alkaline solutions, wherein the compound a) comprises a 1-sulfonyloxy-2-pyridone of the formula (I)

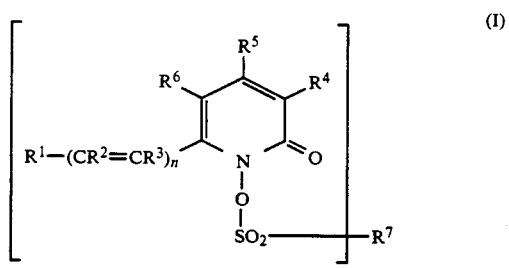

in which
R$^1$ is a hydrogen atom or an alkyl, cycloalkyl, aryl, aralkenyl, heteroaryl or heteroaralkenyl radical,
R$^2$ is hydrogen, chlorine, bromine or an alkyl, cycloalkyl, aryl or heteroaryl radical, or
R$^1$ and R$^2$ together form a five- to eight-membered ring,
R$^3$ is hydrogen or an alkyl radical,
R$^4$ is hydrogen, halogen, nitro, acylamino, cyano, thiocyanato or an alkyl, alkenyl, alkynyl, aryl, aralkyl, alkylthio, arylthio or cycloalkylthio radical,
R$^5$ is hydrogen or an alkyl or aryl radical or
R$^4$ and R$^5$ together form a five- to eight-membered ring,
R$^6$ is hydrogen, halogen, nitro, acylamino, cyano, thiocyanato or an alkyl, alkenyl, alkoxyalkyl, aryl, aralkyl, alkylthio, cycloalkylthio or arylthio radical,
R$^7$ is an alkyl or cycloalkyl radical, a perfluorinated or highly fluorinated alkyl radical or an aryl, arylalkyl or heteroaryl radical or an alkylene or arylene radical,
m is 1 or 2, and
n is 0, 1, 2, or 3.

When m or n or both are greater than 1 the groups R in the repeating units may be the same or different.

An alkyl radical is designated as highly fluorinated, when at least 50% of the alkyl hydrogen atoms are replaced by fluorine atoms.

There has further been provided a positive-working radiation-sensitive recording material comprising a support and a radiation-sensitive layer, wherein the layer comprises a radiation-sensible mixture as described above.

There has also been provided a method of producing such a recording material which comprises dissolving the radiation-sensitive mixture in a solvent, applying the resultant solution to the support, and removing the solvent.

There has further been provided a method of forming a method of forming an image pattern compound, irradiating the radiation-sensitive layer imagewise, optionally heating the layer and treating the layer with a developer which removes the irradiated areas of the layer, and optionally post-hardening the developed layer structures.

Further objects, features, and advantages of the present invention will become apparent from the detailed description of preferred embodiments that follows.

DETAILED DESCRIPTION OF PREFERRED EMBODIMENTS

Under the action of actinic radiation, the compounds a) form reactive intermediates which are capable of initiating specific chemical reactions, for example freeradical polymerizations. When irradiated, however, they especially generate organic acids which catalyze reactions, such as cationic polymerizations, crosslinking reactions or cleavage of acid-unstable compounds or can react with bases, resulting for example, in a color change of indicator dyes.

Those compounds of the formula I are preferred in which

R¹ is an alkyl or cycloalkyl radical or an aryl radical of the formula II

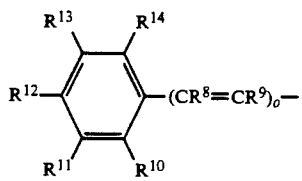

in which

R⁸ and R⁹ are identical or different and are hydrogen an alkyl, preferably a lower alkyl having 1 to 6 carbon atoms, or aryl group, R¹⁰ to R¹⁴ are identical or different and are hydrogen, an alkyl, alkenyl, alkoxy, alkylthio or alkanesulfonyl radical each having up to 6 carbon atoms, a cycloalkyloxy, cycloalkylthio or cycloalkanesulfonyl radical having up to 8 carbon atoms, a phenyl, styryl, phenoxy, phenylthio, benzenesulfonyl, phenylalkoxy, phenylalkylthio or phenylalkanesulfonyl radical which may be substituted on the aromatic ring and has up to 3 carbon atoms in the alkyl chain, hydroxyl, halogen, trifluoromethyl, nitro, cyano, alkoxycarbonyl, carbamoyl which may be substituted on the nitrogen by one or two alkyl radical(s) which may be linked to form a 5- to 7-membered ring, sulfamoyl which may be substituted on the nitrogen by one or two alkyl radical(s) which may be linked to form a 5- to 7-membered ring, alkanesulfonyloxy, arylsulfonyloxy, aylamino, alkylamino or arylamino, or two mutually adjacent substituents R¹⁰ to R¹⁴ form one or two further fused ring(s), and o is 0 or 1.

In addition, those compounds of the formula I are also preferred in which R¹ is a 5- or 6-membered heterocyclic ring having up to three heteroatoms, of the formula III

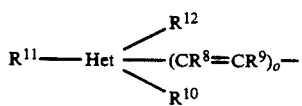

wherein R¹-R¹² are as defined for formula II.

Those compounds of the formula I are also preferred in which

R¹ is a ferrocenyl radical and

R² is hydrogen, chlorine, bromine, alkyl, cycloalkyl or a radical of the formulae II or III or R¹ and R² together form a five- to eight-membered ring, R³ is hydrogen or an alkyl radical, R⁴ is hydrogen, halogen, nitro, acylamino, cyano, thiocyanato or an alkyl, aryl, alkylthio, arylthio or cycloalkylthio radical, R⁵ is hydrogen or an alkyl or aryl radical or R⁴ and R⁵ together form a five- to eight-membered ring, R⁶ is hydrogen, halogen, nitro, acylamino, cyano, thiocyanato or an alkyl, aryl, alkylthio, arylthio or cycloalkylthio radical, R⁷ is an alkyl or cycloalkyl radical, a perfluorinated or highly fluorinated alkyl radical or an aryl, arylalkyl, aryl or heteroaryl radical or an alkylene or arylene radical, m is 1 or 2, and n is 0, 1, 2, or 3.

Those compounds of the formula I are particularly preferred in which R₇ is an alkyl radical having 1 to 4 carbon atoms, a highly fluorinated or perfluorinated alkyl radical having 1 to 4 carbon atoms or an aryl radical of the formula IV

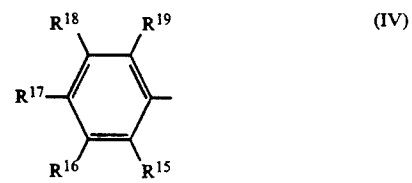

in which R¹⁵ to R¹⁹ are identical or different and each is a hydrogen atom or halogen atom, preferably fluorine, chlorine or bromine, an alkyl radical which have up to 6 carbon atoms and are unsubstituted or substituted by one or more halogen atoms, preferably chlorine or bromine, aryl or aryloxy radicals and in which individual methylene groups can be replaced by oxygen or sulfur atoms and in which in each case two of these radicals can be linked to form a 5- or 6-membered ring, a cycloalkyl radical having up to 8 carbon atoms, an alkenyl radical having up to 6 carbon atoms or an aryl or aryloxy radicals having up to 10 carbon atoms, the total number of the carbon atoms in the radicals R¹⁵ to R¹⁹ being not more than 12.

Those compounds of the formula I are also preferred in which R⁷ is a naphthyl or heteroaryl radical having up to 10 carbon atoms, an alkylene radical having up to 6 carbon atoms or an arylene or heteroarylene radical having up to 14 carbon atoms.

Those compounds of the formula I are very particularly preferred in which

R², R³, R⁴ and R⁵ are each a hydrogen atom,

R⁵ is a methyl group,

R⁷ is a methyl, ethyl, trifluoromethyl, 1,1,2,3,3,3-hexafluoropropyl, phenyl, tolyl, 4-fluorophenyl, 4-chlorophenyl, 4-bromophenyl or 4-nitrophenyl radical, m is 1, and n is 0 or 1.

The radical R⁷ can, for example, be selected from the following: methyl, ethyl, propyl, isopropyl, butyl, hexyl, octyl, decyl, dodecyl, hexadecyl, octadecyl, 10-camphyl, chloromethyl, 2-chloroethyl, 3-chloropropyl, dichloromethyl, trichloromethyl, difluoromethyl, trifluoromethyl, 2,2,2-trifluoroethyl, 3,3,3,2,1,1-hexafluoropropyl, perfluorohexyl, trimethylsilylmethyl, methanesulfonylmethyl, phenyl, benzyl, 4-acetylphenyl, 4-acetylaminophenyl, 2-, 3- or 4-bromophenyl, 2-, 3- or 4-chlorophenyl, 2-, 3- or 4-fluorophenyl, 4-iodophenyl, 2-cyanophenyl, 4-cyanophenyl, 2-, 3- or 4-methylphenyl, 4-ethylphenyl, 4-propylphenyl, 4-isopropylphenyl, 4-isobutylphenyl, 4-tert.-butylphenyl, 4-tert.-amylphenyl, 4-hexylphenyl, 4-methoxyphenyl, 4-butoxyphenyl, 4-hexadecyloxyphenyl, 2-, 3- or 4-trifluoromethylphenyl, 2or 4-trifluoromethoxyphenyl, 2-, 3- or 4-nitrophenyl, 3-or 4-carboxyphenyl, 2-methoxycarbonylphenyl, 4-tetrafluoroethoxyphenyl, β-styryl, 4-acetylamino-3-chlorophenyl, 4-acetylamino-3-fluorophenyl, 3,5-bistrifluoromethylphenyl, 2,5-bis- (2,2,2-trifluoroethoxy)-phenyl, 2,5dimethylphenyl, 2,4-, 2,5- or 3,4-dimethoxyphenyl, 2,4diisopropylphenyl, 5-bromo-2-methoxyphenyl, 2- or 3-chloro-4-fluorophenyl, 3-chloro-2-methylphenyl, 3-chloro-4-methoxyphenyl, 2-chloro-6-methylphenyl, 2-chloro-4-trifluoromethylphenyl, 5-chloro- 2-methoxyphenyl, 5-fluoro-2-methylphenyl, 2,5- or 3,4-dibromophenyl, 2,3-, 2,4-, 2,5-, 2,6-, 3,4- or 3,5-dichlorophenyl, 2-(2,4-dichlorophenoxy)-phenyl, 4-(2-chloro-6-nitrophenoxy)-phenyl, 4-(3-chloro-2-cyanophenoxy)phenyl, 2,4- or 2,5-difluorophenyl, 3-carboxy-4-chlorophenyl, 4-chloro-3-nitrophenyl, 2-methyl-5-nitrophenyl, 4-chloro-3- or 2-chloro-5-trifluoromethylphenyl, 4-(2,2-dichlorocyclopropyl)phenyl, 2,4-dinitrophenyl, 4-dimethylamino-3-nitrophenyl, 2-nitro-4-trifluoromethylphenyl, 2,4,6-trimethylphenyl, 2,4,6-triisopropylphenyl, 2,3,4-, 2,4,5- or 2,4,6-trichlorophenyl, 4-chloro-2,5-dimethylphenyl, 2,4-dichloro-5-methylphenyl, 3,5-dichloro-2-hydroxyphenyl, 3,5-dichloro-4-(4-nitrophenoxy)-phenyl, 4-(2-chloro-4-nitrophenoxy)-3,5-dichlorophenyl, 4-bromo-2,5- -difluorophenyl, 2,4-dimethyl-3-nitrophenyl, 3,5-dinitro-4-methylphenyl, 2,3,5,6-tetramethylphenyl, 4-methoxy-2,3,6-trimethylphenyl, 2,5-dibromo-3,6-difluorophenyl, 2,3,4,5,6-pentafluorophenyl, 1- or 2-naphthyl, 5-diazo-6-oxo-5,6-dihydro-1-naphthyl,6-diazo-5-oxo-5,6-dihydro-1-naphthyl, 5-diazo-6-oxo-5,6-dihydro-8-naphthyl, 5-diazo-3-methoxy-6-oxo-5,6-dihydro-8-naphthyl,5-dimethylamino-1-naphthyl, 1-anthracenyl, 2-anthraquinonyl, 8-quinolinyl, 2-thienyl, 5-chloro-2-thienyl, 4-bromo-2,5-dichloro-3-thienyl, 4,5-dibromo-2-thienyl, 2,3-dichloro-5-thienyl, 2-bromo-3-chloro-5-thienyl, 3-bromo-2-chloro-5-thienyl, 3-bromo-5-chloro2-thienyl, 2,5-dichloro-3-thienyl, 2-(2-pyridyl)-5-thienyl, 5-chloro-1,3-dimethyl-4-pyrazolyl, 3,5-dimethyl-4-isoxazolyl, 2,4-dimethyl-5-thiazolyl, 2-acetylamino-4-methyl-5-thiazolyl, 1,4-butylene, 2-oxo-1,3-propylene, 1,2- or I,3-phenylene, 3-methyl-1,2-phenylene, 2,4,6-trimethyl-1,3-phenylene, 4,4'-biphenylene, 4,4,-methylenediphenylene, 4,4,-oxybiphenylene, 1,5-naphthylene, 2-chloro-3,5-thienylene, 2-(1-methyl-5-trifluoromethylpyrazol-3-yl)-3,5-thienylene.

The radical R' can, for example, be selected from the following: methyl, chloromethyl, bromomethyl, ethyl, propyl, isopropyl, butyl, isobutyl, hexyl, cyclohexyl, octyl, phenyl, 4-acetylaminophenyl, 4-acetoxyphenyl, 3or-4-benzyloxyphenyl, 3-benzyloxy-4-methoxyphenyl, 4-benzyloxy-3-methoxyphenyl, 4-biphenyl, 3,5-bis(trifluoromethyl)-phenyl, 2-, 3- or 4-fluorophenyl, 2-, 3- or 4-chlorophenyl, 2-, 3- or 4-bromophenyl, 4-iodophenyl, 2-, 3- or 4-cyanophenyl, 2-, 3- or 4-methylphenyl, 2-, 3- or 4-ethylphenyl, 2-, 3- or 4-propylphenyl, 2-, 3- or 4-isopropylphenyl, 2-, 3- or 4-butylphenyl, 2-, 3- or 4-isobutylphenyl, 2-, 3- or 4-sec.-butylphenyl, 2-, 3- or 4-tert.-butylphenyl, 2-, 3- or 4-pentylphenyl, 2-, 3- or 4-hexylphenyl, 2-, 3- or 4-cyclohexylphenyl, 2-, 3- or 4-nonylphenyl or 2-, 3- or 4-dodecylphenyl, 2-, 3- or 4-methoxyphenyl, 2-, 3- or 4-ethoxyphenyl, 2-, 3- or 4-isopropoxyphenyl, 2-, 3- or 4-butoxyphenyl, 2-, 3- or 4-pentoxyphenyl, 2-, 3- or 4-octyloxyphenyl, or 2-, 3- or 4-decyloxyphenyl, 2,3-, 2,4-, 2,6-, 3,4- or 3,5-difluorophenyl, 2,3-, 2,4-, 2,6-, 3,4- or 3,5-dichlorophenyl, 2,3-, 2,4-, 2,6-, 3,4- or 3,5-dibromophenyl, 3-(3,4-dichlorophenoxy)-phenyl, 3-(3,5-dichlorophenoxy)-phenyl, 3-bromo-4-fluorophenyl, 5-bromo-2,4-dimethoxyphenyl, 2-chloro-6-fluorophenyl, 2-chloro-5-, 2-chloro-6-, 4-chloro-3-or 5-chloro-2-nitrophenyl, 3-(4-chlorophenoxy)phenyl, 3,4-bisbenzyloxy-phenyl, 2,3-, 2,4-, 2,5-, 3,4or 3,5-dimethoxy-phenyl, 2,3-, 2,4-, 2,5-, 3,4- or 3,5-diethoxy-phenyl, 2,3-, 2,4-, 2,5-, 3,4- or 3,5-dibutoxyphenyl or 2,3-, 2,4-, 2,5-, 3,4- or 3,5-dihexyloxyphenyl, 2,4-dimethoxy-3-methyl-phenyl, 2-ethoxy5-methoxy-phenyl, 3-chloro-4-methyl-phenyl, 2,4- or 2,5-dimethyl-phenyl, 2-, 3- or 4-methoxyethyl-phenyl, 2-, 3-or 4-ethoxyethyl-phenyl, 3- or 4-butoxyethylphenyl, 2,6-dinitro-phenyl, 2,4,6-trimethylphenyl, 3,4,5-trimethoxyphenyl, 3,4,5-triethoxy-phenyl, 2,3- or 3,4-methylenedioxyphenyl, 2- or 3-thienyl, 2-fluorenyl, 9-anthryl, 1-pyrenyl, 9-phenanthryl, 5-bromo-2-thienyl, 3-methyl-2-thienyl, 5-methyl-2-thienyl, 5-nitrofuryl, 10-chloro-9-anthryl or ferrocenyl.

These radicals are preferred particularly for the reason that the starting compounds on which they are based are commercially available. However, further compounds can be prepared in a simple manner by methods familiar to those skilled in the art, and hence any compound falling within the definition of $R^1$ and $R^7$ can be used.

The compounds listed above have absorption maxima in the range between 200 and 550 nm and are therefore very well suitable for irradiation with high-energy UV radiation in the range of UV2 radiation (220 to 280 nm), UV3 radiation (300 to 350 nm) or UV4 radiation (350 to 450 nm), and also with high-energy visible light (450 to 550 nm). They show high activities even on irradiation with radiation of a wavelength of <220 nm; however, because of their high absorption in this region, they are preferentially applicable to so-called "toplayer imaging" processes.

1-Benzenesulfonyloxy- and 1-(toluene-4-sulfonyloxy)-2-pyridone and processes for the preparation thereof are known from E. C. Taylor et al., J. Org. Chem., 35, 1672, 1970. The radiation sensitivity of these compounds was, however, not recognized. Novel 1-sulfonyloxy-2-pyridones are described in Attorney Docket No. 16878/448, which is equivalent to German Patent Application P 41 12 967.9, filed concomitantly, which is hereby incorporated by reference in its entirety. These compounds are useful as a) according to the present invention.

The use of 1-sulfonyloxy-2-pyridones as photooxidants in radiation-sensitive mixtures which contain a leuco dye has been disclosed by U.S. Pat. No. 4,425,424. In such mixtures, the photooxidant effects during irradiation, for example, an oxidation of the leuco dye, results in an intensive color change and causes a visual contrast between exposed and unexposed areas. Such color changes are desired in industry, for example in the production of printing forms, in order to enable the copying result to be assessed after exposure but before development.

The radiation-sensitive mixture according to the present invention is distinguished by a high sensitivity over a wide spectral range. It shows high thermal stability and makes it possible to reproduce precise details of even very fine structures of an original. The acid generated during irradiation does not have a corrosive action, so the mixture can also be used on sensitive substrate materials.

Surprisingly, when the mixtures according to the invention are irradiated, sulfonic acids are generated in a high quantum yield. Due to their high molecular weight, the sulfonic acids show a very small tendency to diffusion or mobility in the radiation-sensitive layer. The high efficiency of the acid generation means that the mixtures according to the invention show a substantially increased sensitivity. The positive-working, radiation-sensitive mixtures according to the invention additionally show not only a high thermal and plasma-etching resistance but also outstanding lithographic properties which allow resolution even in the half-micrometer and sometimes also in the sub-half-micrometer range. After imagewise irradiation and subsequent development, an image of the mask true to the details is obtained. The resist areas show steep flanks. In the irradiated areas, the resist layer is completely detached, i.e., no remnants or residues of the layer remain on the substrate. The sulfonic acids generated in the photolysis lead to an efficient cleavage of the resist component b), which permits the production of high-sensitivity positive-working mixtures.

It was furthermore surprising that the 1-sulfonyloxy-2-pyridones of the formula I can also be activated by high-energy short-wave radiation and that, for example, the production of a high-sensitivity photoresist for high energy UV2 radiation (248 nm) is thus possible. In particular, it was unexpected that there is still a sufficient spectral sensitivity, which leads to cleavage of the molecule to give a sulfonic acid, even in the range of conventional optical lithography (436 nm).

In the mixture according to the invention, the 1-sulfonyloxy-2-pyridones preferably should show a higher molar absorption for radiation of the wavelength from about 220 to 500 nm than the remaining constituents of the mixture.

Recording materials produced with the mixtures according to the invention show an image differentiation which meets the most stringent demands, and an improvement in the contrast and resolving power. For example, the mixtures according to the invention allow a high-sensitivity, positive-working photoresist for high-energy UV2 radiation (for example 248 nm) to be produced.

Since the mixture according to the invention is sensitive over a wide spectral range, any actinic radiation is generally suitable for imagewise irradiation. Actinic radiation is to be understood in this context as meaning any radiation whose energy corresponds to at least to that of shortwave visible light (<550 nm), especially UV radiation in the range from 150 to 550 nm, preferably from 200 to 450 nm and particularly preferably from 240 to 440 nm. Electron beams or X-ray radiation are also suitable here.

Furthermore, the multifunctional sulfonic acid esters can be combined with any other known acid generators such as onium salts, halogen compounds (especially trichloromethyltriazine derivatives or tri-chloromethyloxadiazole derivatives) 1,2-disulfones, o-quinonediazidesulfonyl chlorides or organometal/organohalogen combinations. Mixtures with bis(sulfonyl)-diazomethanes and sulfonyl-carbonyldiazomethanes are also possible. In such mixtures, however, the above-mentioned disadvantages associated with the additional acid generator may reappear.

The content of acid-generating compound a) or the combination of compounds a) in the mixture according to the invention may be varied depending on the intended use of the mixture, and is in general 0.5 to 25% by weight, preferably 1 to 15% by weight, relative to the total weight of the solids in the mixture.

Any known acid cleavable compound or mixtures of such compounds can be used as the instant b). The following classes of compounds have proved suitable above all as acid-cleavable compounds b) in the radiation-sensitive mixture according to the invention:

1) compounds having at least one orthocarboxylic acid ester group and/or carboxylic acid amide-acetal group, the compounds also having a polymeric character and it being possible for said groups to occur in the main chain or in side chains (see DE-A 2,610,842 and 2,928,636); in the following, these compounds are referred to as orthoester derivatives;
2) oligomeric or polymeric compounds with recurring acetal and/or ketal groups in the main chain (see DE-A 2,306,248 and 2,718,254),
3) compounds having at least one enol ether group or N-acyliminocarbonate group (see EP-A 0,006,626 and 0,006,627),
4) cyclic acetals or ketals of $\beta$-ketoesters or $\beta$-ketoamides (see EP-A 0,202,196),
5) compounds having silyl ether groups (see DE-A 3,544,165 and 3,601,264),
6) compounds having silylenol ether groups (see DE-A 3,730,785 and 3,730,783),
7) monoacetals and monoketals of aldehydes and ketones respectively, having a solubility in the developer between 0.1 and 100 g/l (see DE-A 3,730,787),
8) ethers based on tertiary alcohols (see U.S. Pat. No. 4,603,101),
9) carboxylic acid esters and carbonates, whose alcohol component is a tertiary alcohol, an allyl alcohol or a benzyl alcohol (see U.S. Pat. No. 4,491,628 and J. M. Fréchet et al., J. Imaging Sci. 30, 59–64, 1986), and
10) N,O-acetals described in German Patent Application P 41 12 968.7, which is hereby incorporated by reference.

The compound b) or the combination of compounds b) may be present in any desirable amount, and preferably represent a share of 1 to 60% by weight, more preferably 5 to 50% by weight, of the total weight of the solids in the radiation-sensitive mixture.

The radiation-sensitive mixture according to the invention also contains at least one polymeric binder c) which is insoluble in water, but soluble or at least swellable in aqueous alkaline solutions. Any known binder or mixtures of known binders can be used. The binder is distinguished in particular by being compatible with the other constituents of the radiation-sensitive mixture according to the invention and having the lowest possible characteristic absorption, i.e., a high transparency, especially in the wavelength range from 190 to 300 nm.

For conventional applications, i.e., for light sources in the near UV range, binders based on novolak condensation resins, which generally have been used in combination with naphthoquinonediazides as the photoactive components, are particularly suitable as binders. Such phenol-formaldehyde condensates have been described many times and can, as the phenolic component, contain phenol, the three position-isomeric cresols or other alkylphenols, for example xylenols, as components. Apart from formaldehyde, other aldehydes can also be utilized for preparing the polymer. The polymers containing hydroxyl groups, described below, can also be used for irradiations with near UV light, and these can be admixed with the novolak polymers described above in a proportion of up to 50%, preferably up to 20%.

For applications in the UV2 range, however, different polymeric materials are required. In particular, these do not include those novolaks which are generally used as photoactive components in combination with naphthoquinonediazides. Although novolaks show in the exposed areas an increase in the solubility in aqueous alkaline developers after imagewise exposure to short wave radiation, their characteristic absorption in the wavelength range desired for the exposure is undesirably high.

However, a binder comprising a mixture of novolak condensation resins with other resins of higher transparency is suitable. The mixing ratios here depend predominantly on the nature of the binder to be mixed with the novolak resin. Especially important factors are the degree of characteristic absorption of the binder in the said wavelength range, and also the miscibility with the other constituents of the radiation-sensitive mixture. In general, however, the binder of the radiation-sensitive mixture for applications in the UV2 range can contain at most 30% by weight, especially at most 20% by weight, of a novolak condensation resin.

Suitable binders include homopolymers or copolymers of 4-hydroxystyrene and homo and copolymers of alkyl derivatives thereof, for example of 3-methyl-4-hydroxystryene, 2,3- or 3,5-dimethyl-4-hydroxystyrene. Homopolymers or copolymers of other vinylphenols, for example of 2- or 3-hydroxystyrene or esters or amides of acrylic acid with aromatics containing phenolic groups are also useful. Polymerizable compounds such as styrene, methyl (meth)acrylate or the like can be used as comonomers with these binders.

Mixtures having an increased plasma resistance are obtained when silicon-containing vinyl monomers, for example vinyltrimethylsilane, are also used for the preparation of the binders. The transparency of these binders is in general higher in the deep UV range, so that improved structuring is possible.

Homopolymers or copolymers of maleimide can also be used. These binders also show a high transparency in the deep UV range. Here again, the comonomers preferably used are styrene, substituted styrenes, vinyl ethers, vinyl esters, vinylsilyl compounds or (meth)acrylates.

Copolymers of styrene can also be used with comonomers which effect an increase in solubility in aqueous alkaline solutions. These include, for example, maleic anhydride and maleic acid half-esters.

The said binders can also be mixed with one another if this does not impair the optical quality of the radiation-sensitive mixture. However, binder mixtures are generally not preferred.

The binder content can be varied depending on the intended use of the mixture and is in general 30 to 95% by weight, preferably 40 to 90% by weight, particularly preferably 50 to 85% by weight, each relative to the total weight of the solid constituents of the radiation-sensitive mixture.

The extinction of the binder or of the combination of binders for radiation of the wavelength from about 220 to 500 nm is preferably less than 0.5, more preferably less than 0.3 $\mu m^{-1}$.

If appropriate, one or more additives such as dyes, pigments, plasticizers, wetting agents, flow agents, and also polyglycols and cellulose ethers, for example ethylcellulose, can be added to the radiation-sensitive mixtures according to the invention in order to meet special requirements, such as flexibility, adhesion and gloss. Other additives known in the art can also be used.

Any known substrate can be coated with the radiation-sensitive mixture according to the invention. When a substrate is to be coated, the radiation-sensitive mixture according to the invention is expediently dissolved in a solvent or in a combination of solvents. Any known solvent can be used. Ethylene glycol and propylene glycol and the monoalkyl and dialkyl ethers derived from them, (especially the monomethyl and dimethyl ethers) and the monoethyl and diethyl ethers, esters derived from aliphatic ($C_1$–$C_6$) -carboxylic acids and either ($C_1$–$C_8$) -alkanols or ($C_1$–$C_8$)alkanediols or ($C_1$–$C_6$)-alkoxy-($C_1$–$C_8$)-alkanols, (for example ethyl acetate, hydroxyethyl acetate, alkoxyethyl acetate, n-butyl acetate, propylene glycol monoalkyl etheracetate, especially propylene glycolmethyl ether-acetate and amyl acetate), ethers such as tetrahydrofuran and dioxane, ketones such as methyl ethyl ketone, methyl isobutyl ketone, cyclopentanone and cyclohexanone, N,N-dialkyl-carboxylic acid amides such as N,N-dimethylformamide and N,N-dimethylacetamide, and also hexamethylphosphotriamide, 1-methyl-pyrrolidin-2-one and butyrolactone, and also any desired mixtures of these, are particularly suitable for this purpose. Amongst these, the glycol ethers, aliphatic esters and ketones are particularly preferred.

Ultimately, the choice of the solvent or solvent mixture depends on the coating process used, on the desired layer thickness and on the drying conditions. The solvents must also be chemically inert to the other layer constituents under the conditions used.

The solution prepared with the said solvents generally has a solids content from 5 to 60% by weight, preferably up to 50% by weight.

Finally, the invention also relates to a radiation-sensitive recording material which is comprised of a substrate and preferably located thereon, a radiation-sensitive layer of the radiation-sensitive mixture according to the invention.

Possible substrates are all those materials of which capacitors, semiconductors, multi-layer printed circuits or integrated circuits are composed, or from which these can be produced. Silicon substrates which can also be thermally oxidized and/or coated with aluminum, and also doped, merit special mention. In addition, all other substrates used in semiconductor technology are possible, such as silicon nitride, gallium arsenide and indium phosphide. Moreover, the substrates known from liquid crystal display manufacture are possible, such as glass or indium-tin oxide, and also metal plates and foils, for example aluminum, copper, or zinc foils, bimetal and trimetal foils, and also electrically nonconductive foils on which metals have been vapor deposited, and paper. These substrates can be thermally pretreated, superficially roughened, incipiently etched or pretreated with chemicals to improve desired properties, for example to enhance the hydrophilic character.

To impart better cohesion and/or better adhesion of the radiation-sensitive layer to the substrate surface, the layer can contain an adhesion promoter. The same effect can be achieved by an adhesion-promoting interlayer located between the substrate and the radiation-sensitive mixture. In the case of silicon or silica substrates, adhesion promoters of the aminosilane type such as, for example, 3-aminopropyltriethoxysilane or hexamethyldisilazane, can be used for this purpose.

Suitable supports for the production of photomechanical recording layers, such as printing forms for letterpress printing, planographic printing, screen printing and flexographic printing, are in particular aluminum plates, which may have been anodically oxidized, grained and/or silicated beforehand, and also zinc and steel plates which may be chromium-plated, and also plastic films and paper.

The recording material according to the invention is exposed imagewise with actinic radiation. Any source of such radiation can be used. Suitable radiation sources are especially metal halide lamps, carbon arc lamps, xenon lamps and mercury vapor lamps. Likewise, exposure can be carried out with high-energy radiation such as laser radiation, electron beams or X-rays. However, lamps which can emit light of a wavelength from 190 to 260 nm, especially xenon lamps and mercury vapor lamps, are particularly preferred. Furthermore, laser light sources can also be used, for example excimer lasers, especially KrF or ArF lasers, which emit at 248 and 193 nm respectively. The radiation sources must show adequate emission in the said wavelength ranges.

The thickness of the light-sensitive layer can be varied depending on the intended use. In general, it is between 0.1 and 100 $\mu$m, preferably between 1 and 10 $\mu$m.

The invention also relates to a process for preparing a radiation-sensitive recording material. The radiation-sensitive mixture can be applied to the substrate by any known manner such as spraying, flow-coating, rolling, whirler-coating and dip-coating. The mixture can also be applied to a layer which is coated on the support, such promoting layer. The solvent is then removed by evaporation, so that the radiation-sensitive layer remains on the surface of the substrate. The removal of the solvent can be promoted by heating the layer to temperatures of up to 150° C. The mixture can, however, also be first applied in the above-mentioned way to a temporary support, from which it is transferred under pressure and at an elevated temperature to the final support material. The materials used as temporary support can in principle be all those which are also suitable as support materials. Subsequently, the layer is irradiated imagewise and, if necessary, heated to accelerate the cleavage reaction. The layer is then treated with a developer solution which dissolves and removes the irradiated areas of the layer, so that an image of the original used in the imagewise irradiation remains on the substrate surface.

Suitable developers include all those known in the art, and are especially aqueous solutions which contain silicates, metasilicates, hydroxides, hydrogen phosphates and dihydrogen phosphates, carbonates or hydrogen carbonates of alkali metal ions, alkaline earth metal ions and/or ammonium ions, and also ammonia and the like. Metal ion-free developers are described in EP-A 0,023,758, 0,062,733 and 0,097,282 and in U.S. Pat. Nos. 4,141,733, 4,628,023 and 4,729,941. The content of these substances in the developer solution is in general 0.1 to 15% by weight, preferably 0.5 to 5% by weight, relative to the weight of the developer solution. Preferably, metal ion-free developers are used. Small quantities of a wetting agent can also be added to the developers, in order to facilitate the detachment of the soluble areas of the layer.

The developed layer structures can optionally be post-hardened. This is effected in any known manner, and is in general effected by heating on a hotplate up to a temperature below the flow temperature and subsequent exposure of the whole area with the UV light from a xenon-mercury vapor lamp (range from 200 to 250 nm). As a result of the post-hardening, the image structures are crosslinked, so that in general they have a flow resistance up to temperatures of more than 200° C. The post-hardening can also be effected without a temperature increase solely by irradiation with a high dosage of high-energy UV light.

The radiation-sensitive mixture according to the invention may be used in the production of integrated circuits or individual electrical components by lithographic processes, since they show a high light sensitivity, especially in the case of irradiation with light of a wavelength between 190 and 300 nm. Since the mixtures bleach very well on exposure, finer structures can be obtained than is possible with the known mixtures. The developed resist layer here serves as a mask for the subsequent process steps. Examples of such steps are etching of the layer support, implantation of ions in the layer support, or precipitation of metals or other materials on the layer support.

The examples described below illustrate the invention, but they are not intended to limit the invention. In the following text, p.b.w. means parts by weight and p.b.v. means parts by volume, which has the same relationship to parts by weight as does g to cm$^3$.

PREPARATION EXAMPLE 1

Stage 1: 88 p.b.w. of acetyl chloride and 128 p.b.w. of methyl 2,3-dimethylcrotonate were added dropwise at 15° C. to 280 p.b.w. of aluminum trichloride in 250 p.b.v. of methylene chloride. The solution was heated under reflux for 3 hours and, after cooling, poured onto ice. After the organic phase had been separated off, the remaining mixture was thoroughly stirred with 500 p.b.v. of methylene chloride. The combined organic phases were washed with water, and a solution of 76 p.b.w. of hydroxylamine hydrochloride in 200 p.b.v. of water was then slowly added. With the onset of heating, the methylene chloride distilled off. The solution was heated for 3 hours to a bath temperature of 120° C. After cooling, it was extracted with n-hexane. The pH of the remaining aqueous solution was adjusted to 5 with a 5% sodium hydroxide solution. The depositing precipitate was filtered off with suction, triturated with water, again filtered off with suction and dried. This gave 82 p.b.w. of 1-hydroxy-3,4,6-trimethyl-2-pyridone having a melting point of 130° C.

Stage 2: A solution of 3.4 p.b.w. of triethylamine in 20 p.b.v. of methylene chloride was slowly added dropwise with stirring to a solution, cooled to 5° C., of 5.0 p.b.w. of the compound described above and 6.8 p.b.w. of 4-fluorobenzenesulfonyl chloride in 60 p.b.v. of methylene chloride, in such a way that the preset temperature remained constant. The solution was then heated to room temperature and stirred for 72 hours. The organic phase was then washed with water, dried and concentrated. This gave 10.8 p.b.w. of a crude product having a melting point of 120° C. This was again dissolved in methylene chloride and passed over a silica gel column; the solvent used was methylene chloride. The combined product fractions were concentrated. This gave 8.6 p.b.w. of 1-(4-fluorobenzenesulfonyloxy)-3,4,6-trimethyl-2-pyridone having a melting point of 123° C.

Analysis: calculated: C 54.01%; H 4.53%; N 4.50%; (311.34) found: C 53.9: H 4.7%; N 4.6%;

PREPARATION EXAMPLE 2

1st Stage: 230 p.b.w. of methyl 3-methylcrotonate was added at 50° to 60° C. to a suspension of 532 p.b.w. of aluminum trichloride in 250 p.b.v. of ethylene chloride and 282 p.b.w. of chloroacetyl chloride in such a way that the temperature was held constant. The mixture was then heated for one hour to 65° to 70° C. and poured onto ice. The aqueous phase was extracted with methylene chloride and the organic phase was washed with water and saturated sodium hydrogen carbonate solution. After drying over sodium sulfate, the product was fractionally distilled. Yield: 280 p.b.w. (74%), boiling point 120° to 122° C./5 mm Hg.

2nd Stage: 382 p.b.w. of the product described above was dissolved in a mixture of 1000 p.b.v. of glacial acetic acid and 10 p.b.v. of concentrated sulfuric acid, and the solution was heated to boiling. The calculated quantity of methyl acetate was distilled off through a short column. The glacial acetic acid was then removed in vacuo and the residue was poured into ice water. The pyrone crystallized. For further purification, the product separated off can be distilled at 116° to 117° C./2 mm Hg. After recrystallization from carbon tetrachloride, this gave 296 p.b.w. of 6-chloromethyl-4-methyl-2-pyrone. Yield: 93%, melting point 78° C.

3rd Stage: 320 p.b.w. of the product described above was heated under reflux for 8 hours together with 540 p.b.w. of triphenylphosphine and 1500 p.b.v. of acetonitrile. The mixture was cooled in ice and the precipitated product was filtered off with suction. The mother liquor was concentrated, and further product precipitated, which was filtered off with suction. This gave 799 p.b.w. of (4-methyl-6-oxo-6H-pyron-2-ylmethyl)-triphenyl-phosphonium chloride.

4th Stage: 106 p.b.w. of the product described above was dissolved in 200 p.b.v. of methanol together with 35.5 p.b.w. of 4-chlorobenzaldehyde. A solution of 6 p.b.w. of sodium in 150 p.b.v. of methanol was poured into the solution, the mixture assuming a transient red color and reacting highly exothermically. The mixture was stirred for 6 hours at room temperature and cooled to −25° C., and the precipitated product was filtered off with suction. The latter was washed with cooled methanol, stirred with water and again filtered with suction. This gave 26 p.b.w. of 6-(4-chlorostyryl)-4-methyl-2-pyrone, which can be recrystallized from acetonitrile, melting point 144° C.

5th Stage: 22.5 p.b.w. of the product described above was heated to about 70° C. with 9 p.b.w. of hydroxylamine hydrochloride and 110 p.b.w. of 2-aminopyridine. The mixture was left for 72 hours at this temperature, a further 3.3 p.b.w. of hydroxylamine hydrochloride being added each time after 3, 18, 30 and 42 hours. After the mixture had cooled down, it was taken up in methylene chloride and washed with dilute hydrochloric acid and water. The organic phase was stirred up in a solution of 10 p.b.w. of sodium hydroxide in 700 p.b.v. of deionized water, and the resulting sodium salt was filtered off and dissolved in 600 p.b.v. of hot water. The aqueous solution was adjusted to pH 5 by addition of glacial acetic acid and cooled. The crude product thus crystallizing was filtered off with suction and dried. This gave 15 p.b.w. of a crude product having a melting point of 195° C., which was recrystallized from methylene chloride. This gave yellowish crystals of [6-(4-chlorostyryl)-1-hydroxy-4-methyl-2-pyridone] having a melting point of 205° C.

Analysis: calculated: C 64.25%; H 4.62%; N 5.35%; (261.70) found: C 64.2%; H 4.6%; N 5.4%.

6th Stage: 1.85 p.b.w. of triethylamine in 20 p.b.v. of methylene chloride was added dropwise at 10° C. to a solution of 4 p.b.w. of the product described above and 20 p.b.w. of methanesulfonyl chloride in 50 p.b.v. of methylene chloride. The solution was stirred at room temperature for 24 hours, extracted by shaking with water, and the solvent was removed in a rotary evaporator. The crystalline product was dried, passed on a silica gel column, and eluted with methylene chloride. The combined product fractions gave, after concentrating, 4.2 p.b.w. of 6-(4-chlorostyryl)-1-methanesulfonyloxy4-methyl-2-pyridone having a decomposition point of 190° C. A sample was recrystallized from acetonitrile and gave a product having a melting point of 193° C.

Analysis: calculated-: C 53.02%; H 4.15%; N 4.12%; (339.77) found: C 52.7%; H 4.4%; N 4.2%.

PREPARATION EXAMPLE 3

Stage 1:11.2 p.b.w. of 4,6-diphenyl-2-pyrone was stirred for 22 hours at 80° C. together with 30 p.b.w. of 2-aminopyridine and 10.4 p.b.w. of hydroxylamine hydrochloride. After the mixture had cooled down, 200 p.b.v. of methylene chloride was added. The organic phase was then washed with a solution of 30 p.b.v. of concentrated hydrochloric acid and 200 p.b.v. of water and then with water alone, extracted twice by shaking with a solution of 10 p.b.w. of sodium hydroxide and 300 p.b.w. of water, and the aqueous extracts were adjusted to pH 4 by addition of glacial acetic acid. The precipitate was filtered off with suction, washed with water and dried. The yield was 10.6 p.b.w. of 1-hydroxy-4,6-diphenyl-2-pyridone having a melting point of 159° C.

Stage 2: A solution of 2.1 p.b.w. of triethylamine in 20 p.b.v. of methylene chloride was slowly added with stirring to a solution of 5.0 p.b.w. of the compound described above and 4.64 p.b.w. of 4-chlorobenzenesulfonyl chloride in 50 p.b.v. of methylene chloride cooled to 5° C. in such a way that the temperature remained constant. The solution was heated to room temperature and stirred for 120 hours. The organic phase was then washed with water, dried and concentrated. This gave 8.6 p.b.w. of a crude product. This was twice digested in hot diisopropyl ether and filtered off with suction. Subsequently, it was recrystallized from acetonitrile. This gave 7.1 p.b.w. of 1-(41-chlorobenzenesulfonyloxy)-4,6-diphenyl-2-pyridone. The compound had a decomposition12 point of 165° C.

Analysis: calculated: C 63.08%; H 3.68%; N 3.20%; (437.91) found: C 63.3%; H 3.7%; N 3.3%.

PREPARATION EXAMPLE 4

Stage 1:41.4 p.b.w. of 6-cyclohexyl-1-hydroxy-4-methyl-2-pyridone was dissolved in 220 p.b.w. of concentrated sulfuric acid, and 18 p.b.w. by weight of sodium nitrate was added in the course of 1 hour with ice cooling. The solution was stirred for a further 7 hours at 0° C., poured onto ice, and extracted with methylene chloride. The organic phase was washed several times with water, dried, filtered and concentrated. The residue was dissolved in methanol, reprecipitated, and then recrystallized from carbon tetrachloride. This gave 11.6 p.b.w. of the product, nitrated in the 3-position, and having a melting point of 160° C.

Stage 2: A solution of 2.6 p.b.w. of triethylamine in 20 p.b.v. of methylene chloride was slowly added with stirring to a solution, cooled to 5° C., of 6.0 p.b.w. of the compound described above and 3.0 p.b.w. of methanesulfonyl chloride in 50 p.b.v. of methylene chloride, in such a way that the temperature remained constant. The solution was heated to room temperature and stirred for 100 hours. The organic phase was then washed with water, dried and concentrated. This gave 8.3 p.b.w. of a crude product having a melting point of about 170° C. This was dissolved in methylene chloride and chromatographed over a silica gel column with methylene chloride as the solvent. The fractions obtained were concentrated, giving 7.2p.b.w. of 6-cyclohexyl-1-methanesulfonyloxy-4-methyl-3-nitro-2-pyridone. The compound had a melting point of 169° C.

Analysis: calculated: C 47.26%; H 5.49%; N 8.48%; (330.37) found: C 47.1%; H 5.5%; N 8.5%.

PREPARATION EXAMPLE 5

Stage 50 p.b.w. of 1-hydroxy-4,6-dimethyl-2-pyridone was stirred for 8 hours at 130° C. together with 131 p.b.w. of sodium benzenesulfinate, 24 p.b.w. of paraformaldehyde and 250 p.b.w. of glacial acetic acid. After cooling, the precipitated product was filtered off with suction, washed with water and methanol and dried.

Stage 2: 6.0 p.b.w. of sodium was dissolved in 90 p.b.w. of methanol, and 27 p.b.w. of the compound described above was added. The solution was stirred at 80° C. for about 120 hours. After the mixture had cooled, it was freed of solvent, dissolved in water and adjusted with concentrated hydrochloric acid to pH 3. The precipitate was filtered off, and the remaining mother liquor was extracted with methylene chloride. The organic phase was washed, dried and concentrated. The residue was recrystallized from methanol and gave 10.2 p.b.w. of the desired product having a melting point of 120° C.

Stage 3: A mixture of 3.0 p.b.w. of triethylamine in 20 p.b.v. of methylene chloride was slowly added with stirring to a solution of 6.0 p.b.w. of the compound described above and 3.4 p.b.w. of methanesulfonyl chloride in 50 p.b.w. of methylene chloride, cooled to 5° C. in such a way that the preset temperature remained constant. The mixture was heated to room temperature and stirred for 80 hours. The organic phase was then washed with water, dried and concentrated. This gave 10.2 p.b.w. of a viscous crude product. This was dissolved in methylene chloride and chromatographed over a silica gel column with methylene chloride as the solvent. The fractions obtained were concentrated, giving 5.9 p.b.w. of crude 1-methanesulfonyloxy-3,5-bis-methoxymethyl-4,6-dimethyl-2-pyridone. After recrystallization from diisopropyl ether, 4.8 p.b.w. of pure product melting at 73° C. remained.

Analysis: calculated: C 47.20%; H 6.27%; N 4.59%; (305.36) found: C 46.9%; H 6.6%; N 4.6%.

PREPARATION EXAMPLE 6

Stage 1: A mixture of 23.6 p.b.w. of cyanoacetyl chloride in 25 p.b.w. of methylene chloride was added dropwise in the course of 20 minutes at a temperature of 20° C. to 28 p.b.w. of O-benzylhydroxylamine and 23.7 p.b.w. of triethylamine in 200 p.b.v. of methylene chloride. After the solution had been stirred for one further hour, it was washed with water, dried and concentrated. This gave 45 p.b.w. of N-benzyloxy-2-cyanoacetamide.

Stage 2: 24 p.b.w. of the product described above, 12.7 p.b.w. of acetylacetone and 1 p.b.w. of diethylamine were dissolved in 50 p.b.v. of ethanol and heated under reflux for 1.5 hours. The solution was cooled to −20° C., and the precipitated crystals, which represent the desired 1-benzyloxy-3-cyano-4,6-dimethyl-2-pyridone, were filtered off with suction.

Stage 3: 28 p.b.w. of the product described above was dissolved in 400 p.b.v. of methanol in an autoclave, and i p.b.w. of a 10% palladium/barium sulfate catalyst was added. The mixture was hydrogenated at room temperature with hydrogen, 2.8 of hydrogen being absorbed. Undissolved constituents of the mixture were filtered off, and the solution was concentrated. This gave 16.5 p.b.w. of 3-cyano-1-hydroxy-4,6-dimethyl-2-pyridone having a melting point of 240° C.

Stage 4: A solution of 2.0 p.b.w. of triethylamine in 20 p.b.v. of methylene chloride was slowly added with stirring to a solution, cooled to 5° C., of 2.9 p.b.w. of the compound described above and 2.3 p.b.w. of methanesulfonyl chloride in 50 p.b.v. of methylene chloride, in such a way that the preset temperature remained constant. After heating to room temperature, the solution was stirred for a further 100 hours, washed with water, dried and concentrated. This gave 4.0 p.b.w. of a crude product having a melting point of about 150° C. This was dissolved in methylene chloride and chromatographed over a silica gel column with methylene chloride as the solvent. The fractions obtained were concentrated, giving 3.2 p.b.w. of crude 3-cyano-1-methanesulfonyloxy-4,6-dimethyl-2-pyridone. Recrystallization from n-hexane and drying gave 3.0 p.b.w. of pure product which melted at 151° C., solidified again and showed a second sharp melting point at 167° C.

Analysis: calculated: C 44.62%; H 4.16%; N 11.57%; (242.27) found: C 44.3%; H 4.2%.

PREPARATION EXAMPLE 7

Stage A mixture of 106 p.b.w. of isobutyryl chloride and 137 p.b.w. of methyl 3-methylcrotonate was added dropwise in the course of 2 hours at about 10° C. to 380 p.b.w. of aluminum trichloride in 350 p.b.v. of methylene chloride. The mixture was heated under reflux for 15 hours and, after cooling, decomposed on ice. After addition of further methylene chloride, the mixture was thoroughly stirred, and the organic phase was separated off, washed and dried. After concentrating the solvent, the residue was distilled in vacuo. Yield: 164 p.b.w. of 6-isopropyl-4-methyl-2-pyrone, boiling point 95 to 110° C./1 mm Hg.

Stage 2: 16 p.b.w. of hydroxylamine hydrochloride was dissolved in a mixture of 10 p.b.w. of water/100 p.b.w. of methanol, and 36.8 p.b.w. of the product described above was added. After stirring for 2 hours at room temperature, 20 p.b.w. of sodium hydroxide in 30 p.b.w. of water was added to the solution, stirring was continued for i hour, 200 p.b.w. of water were added, and the solution was extracted with methylene chloride. The aqueous phase was then adjusted to pH 4 and the precipitated product (1-hydroxy-6-isopropyl-4-methyl-2-pyridone) was filtered off with suction and dried.

Stage 3: A solution of 2.8 p.b.w. of triethylamine in 30 p.b.v. of methylene chloride was slowly added with stirring to a solution of 4.0 p.b.w. of the compound described above and 3.45 p.b.w. of methanesulfonyl chloride in 50 p.b.v. of methylene chloride, cooled to 5°

C. in such a way that the preset temperature remained constant. The mixture was heated to room temperature and stirred for 35 hours. The organic phase was then washed with water, dried and concentrated. This gave 6.2 p.b.w. of a crude product having a melting point of about 110° C. This was dissolved in methylene chloride and chromatographed over a silica gel column with methylene chloride as the solvent. The fractions obtained were concentrated, giving 4.9 p.b.w. of 6-isopropyl-1-methanesulfonyloxy-4-methyl-2-pyridone. Recrystallization from diisopropyl ether gave 3.9 p.b.w. of product which melted at 113° C.

Analysis: calculated: C 48.96%; H 6.16%; N 5.71%; (245.31) found: C 49.2%; H 6.3%; N 5.6%.

PREPARATION EXAMPLE 8

1st Stage: 108 p.b.w. of triethyl phosphite was slowly added dropwise with stirring at 100° C. in a distillation apparatus to 79.3 p.b.w. of 6-chloromethyl-4-methyl-2-pyrone (see Preparation Example 1, 2nd Stage). At this stage, ethyl chloride distilled over into the receiver. When the elimination of ethyl chloride subsided, the bath temperature was slowly increased to 130° C. and the mixture was stirred for about 6 hours at this temperature. After this time, a further 320 p.b.w. of 6-chloromethyl-4-methyl-2-pyrone was added to the mixture, and 432 p.b.w. of triethyl phosphite was slowly added dropwise at a bath temperature of 140° C. The mixture was stirred at this temperature for a further 9 hours. After cooling, volatile constituents of the mixture were distilled off in the course of about 3 hours at 70° C. in the vacuum of an oil pump. 610 p.b.w. of 6-diethoxy-phosphorylmethyl-4-methyl-2-pyrone remained as a viscous residue, which started to crystallize after some time.

2nd Stage: 7.75 p.b.w. of sodium hydride (80% suspension) was added under inert gas and with intensive stirring to a mixture of 45.5 p.b.w. of benzophenone, 65 p.b.w. of the compound described above and 200 p.b.v. of 1,2-dimethoxyethane. The mixture was stirred for 24 hours at 70° C. The mixture was taken up in methylene chloride, washed several times with water, dried and concentrated in a rotary evaporator. This gave 74.3 p.b.w. of a crude product which contained two components and was separated over a silica gel column with methylene chloride as the solvent. The fractions containing the product with the higher retention time were combined and concentrated. This gave 55 p.b.w. of crystalline 6-(2,2-diphenylvinyl)-4-methyl-2-pyrone, which can be recrystallized from hexane.

3rd Stage: 20 p.b.w. of the product described above was heated with 5.6 p.b.w. of hydroxylamine hydrochloride and 80 p.b.w. of aminopyridine to about 75° C. The mixture was left at this temperature for 58 hours, a further 2.8 p.b.w. of hydroxylamine hydrochloride being added each time after 6, 22 and 32 hours. After the mixture had cooled down, it was taken up in methylene chloride and washed with dilute hydrochloric acid and water, dried and concentrated. The resulting residue, 22 p.b.w., was recrystallized from acetonitrile. This gave 14 p.b.w. of a yellow product [6-(2,2-diphenylvinyl)-1-hydroxy-4-methyl-2-pyridone] having a melting point of 169° C.

Analysis calculated: C 79.18%; H 5.65%; N 4.62%; (303.26) found: C 79.0%; H 5.8%; N 4.5%.

4th Stage: 3 p.b.w. of triethylamine in 20 p.b.v. of methylene chloride was added dropwise at 5° to 10° C. to a solution of 8 p.b.w. of the product described above and 3.5 p.b.w. of methanesulfonyl chloride in 70 p.b.v. of methylene chloride. The mixture was stirred for a further 24 hours at room temperature, extracted with water by shaking, and the solvent was removed in a rotary evaporator. The viscous residue amounting to about 12.5 p.b.w. crystallized when left to stand and had a melting point of about 130° C. The crude product was eluted with methylene chloride over a silica gel column. After concentrating, the combined product fractions gave 8.2 p.b.w. of 6-(2,2-diphenylvinyl)-1-methanesulfonyloxy-4-methyl-2-pyridone having a melting point of 140° C.

Analysis: calculated: C 66.12%; H 5.02%; N 3.67%; (381.44) found: C 65.7%; H 5.1%; N 3.4%.

PREPARATION EXAMPLE 9

Stage 1: 85 p.b.w. of (4-methyl-6-oxo-6H-pyron-2-ylmethyl)-triphenyl-phosphonium chloride (see Preparation Example 1, 3rd Stage) and 41.2 p.b.w. of anthracene 9-carbaldehyde were dispersed in 200 p.b.v. of methanol. A solution of 5 p.b.w. of sodium in 100 p.b.v. of methanol was added fairly rapidly with stirring to the dispersion, causing the mixture to warm up. This was stirred for i hour at about 50° C. and then for a further 72 hours at room temperature, and subsequently cooled down to −25° C. The precipitated product was filtered off with suction, washed with methanol, then stirred with water and again filtered off with suction. This gave 52 p.b.w. of 6-(2-anthracene-9-yl-vinyl)-4-methyl-2-pyrone having a melting point of about 200° C., which showed a melting point of 203° C. when recrystallized from acetonitrile.

Stage 2: 20 p.b.w. of the pyrone described above was heated to 70° C. with 5.6 p.b.w. of hydroxylamine hydrochloride and 80 p.b.w. of 2-aminopyridine. The mixture was left for 72 hours at this temperature, a further 2.8 p.b.w. of hydroxylamine hydrochloride being added each time after 7, 23 and 32 hours. After the mixture had cooled down, it was taken up in methylene chloride and washed with dilute hydrochloric acid and water. A part of the product thus precipitated. The organic phase was concentrated in a rotary evaporator. The residue was recrystallized from dimethylformamide (DMF). The crystals obtained were, together with the precipitated product, again recrystallized from DMF and washed with methanol. This gave 12.6 p.b.w. of an analytically pure orange-colored powder [6-(2-anthracene-9-yl-vinyl)-1-hydroxy 4-methyl-2-pyridone] which had a melting point of >260° C.

Analysis: calculated: C 80.71%; H 5.24%;. N 4.28% (327.39) found: C 80.9%; H 5.4%; N 4.3%.

3rd Stage: 4.5 p.b.w. of the compound described above and 1.83 p.b.w. of methanesulfonyl chloride were dissolved in 50 p.b.v. of methylene chloride, and the solution was cooled to 5° C. A mixture of 1.6 p.b.w. of triethylamine in 20 p.b.v. of methylene chloride was slowly added dropwise to the solution. The mixture was stirred for a further 3 days at room temperature. The organic phase was washed with water and dried, and the solvent was stripped off in a rotary evaporator. The residue was again taken up in methylene chloride and eluted over a silica gel column with methylene chloride as the solvent. The clearly identifiable main fraction was collected and freed of solvent, and the remaining foam-like product was stirred with warm diisopropyl ether. After drying, this gave I.9 p.b.w. of 6-(2-anthracene-9-yl-vinyl)-1-methanesulfonyloxy-4-methyl-2- pyridone which decomposed at a temperature of 180° C. with deflagration.

Analysis: calculated: C 68.13%; H 4.72%; N 3.46%; (405.48) found: C 68.1%; H 4.9%; N 3.3%.

PREPARATION EXAMPLE 10

Stage 1: 26 p.b.w. of 6-diethoxyphosphorylmethyl-4-methyl-2-pyrone (see Preparation Example 2, 1st Stage) and 17.4 p.b.w. of 4-trifluoromethylbenzaldehyde were dissolved in 80 p.b.v. of 1,2-dimethoxyethane. Under nitrogen, 3.2 p.b.w. of an 80%; sodium hydride dispersion was then added in portions in such a way that the reaction mixture did not heat up to more than 50° C. It was stirred for a further 18 hours at this temperature and, after cooling, diluted with methylene chloride. The solution was washed several times with water, dried and concentrated. 26.9 p.b.w. of a crystalline powder remained which was eluted over a silica gel column with methylene chloride as the solvent. After concentrating, the main fraction gave 18.9 p.b.w. of a powder with a melting point of 155° C., which proved to be the desired analytically pure 4-methyl-6-(4-trifluoromethyl-styryl)-2-pyrone.

Stage 2: 15 p.b.w. of the product described above, 45 p.b.w. of imidazole, 5 p.b.w. of N-methylpyrrolidone and 5.6 p.b.w. of hydroxylamine hydrochloride were heated for 55 hours at 75° C. with stirring. A further 2.8 p.b.w. of hydroxylamine hydrochloride was added each time after 8, 24 and 32 hours of reaction time. After the mixture had cooled down, it was taken up in methylene chloride, washed with water, dried and concentrated. This gave 14.6 p.b.w. of a crude product which was recrystallized from ethylene glycol monomethyl ether. The 1-hydroxy-4-methyl-6-(4-trifluoromethyl-styryl)-2-pyridone which had crystallized out showed a melting point of 230° C.

Analysis: calculated: C 61.02%; H 4.10%; F 19.30%; N 4.74% (295.28) found: C 61.3%; H 4.1%.

Stage 3: 1.8 p.b.w. of the compound described above and 1.9 p.b.w. of 4-bromobenzenesulfonyl chloride were dissolved in 40 p.b.v. of methylene chloride and the solution was cooled to 5° C. A mixture of 1.0 p.b.w. of triethylamine in 5 p.b.v. of methylene chloride was slowly added dropwise to the solution. Stirring was continued for a further 66 hours at room temperature. The organic phase was washed with water and dried, and the solvent was stripped off in a rotary evaporator. The residue (3.2 p.b.w.) was again taken up in methylene chloride and eluted over a silica gel column with methylene chloride/methanol (99/1) as the solvent. The clearly identifiable main fraction was collected and freed of solvent, and the remaining foam-like product was stirred with warm diisopropyl ether, causing crystallization of the product to take place. After drying, this gave 2.2 p.b.w. of 1-(4-bromobenzenesulfonyloxy)-4-methyl-6-(4-trifluoromethyl-styryl)-2-pyridone which melted at a temperature of 158° C.

Analysis: calculated: C 49.04%; H 2.94%. N 2.72%; F 11.08%. (514.33) found: C 48.6%; H 3.1%; N 2.7%.

The compounds 11 to 75 in Table 1, which follows, can also be prepared in an analogous manner. Some of the compounds listed and their preparation process are described in detail in Patent Application Hoe 3082 filed concomitantly, which is hereby incorporated by reference.

APPLICATION EXAMPLES

These examples 1 to 20 demonstrate the suitability of the mixture according to the invention for recording materials in microlithography, using radiation of different energies. The superiority of the mixtures according to the invention over the state of the art is demonstrated by reference to Comparison Examples 21 and 22. Examples 23 and 24 document the applicability of the mixture in printed circuits and planographic printing plates.

EXAMPLE 1

A coating solution was prepared from 7.5 p.b.w. of a cresol-formaldehyde novolak having a softening range from 105° to 120° C., 2.5 p.b.w. of piperonal bis-(butoxyethyl)-acetal, prepared analogously to Preparation Example 1 of EP-A 312,751, which is hereby incorporated by reference and 0.7 p.b.w. of 6-(4-chloro-styryl)-1-methanesulfonyloxy-4-methyl-2-pyridonein 42 p.b.w. of propylene glycol monomethyl ether-acetate.

The solution was filtered through a filter of 0.2 $\mu$m pore diameter and whirler-coated at 3,100 rpm onto a wafer treated with an adhesion promoter (hexamethyl-disilazane). After drying at 100° C. for 1 minute on a hotplate, the layer thickness was 1.10 $\mu$m.

The recording material was exposed imagewise under an original to the radiation of a xenon-mercury vapor lamp at 365 nm at an energy of 115 mJ/cm$^2$ and heated for 2 minutes to 90° C.

The recording material was developed with a 0.3N alkaline developer of the following composition:

5.3 p.b.w. of sodium metasilicate x 9H$_2$O,
3.4 p.b.w. of trisodium phosphate x 12 H$_2$O,
0.3 p.b.w. of sodium dihydrogen phosphate and
91 p.b.w. of deionized water After a developing time of 90 seconds, this gave a defect-free image of the mask with steep resist flanks, structures of 0.7 $\mu$m also being resolved in true detail. An examination of the flanks of the resist profiles by means of scanning electron microscopy proved that these were aligned virtually perpendicular to the substrate surface.

EXAMPLE 2

A coating solution was prepared from 7.5 p.b.w. of a copolymer of styrene/p-hydroxystyrene (20/80) having a mean molecular weight of 32,000, 2.5 p.b.w. of 3,4-dimethoxybenzaldehyde bis(phenoxyethyl)-acetal, prepared analogously to Preparation Example 1 of EP-A 312,751, and 0.7 p.b.w. of (4-fluoro-benzenesulfonyloxy)-3,4,6-trimethyl-2-pyridone in 42 p.b.w. of propylene glycol monomethyl ether-acetate.

The solution was filtered through a filter of 0.2 $\mu$m pore diameter and whirler-coated at 3,000 rpm onto a wafer treated with an adhesion promoter (hexamethyl-disilazane). After drying for 1 minute at 100° C. on a hotplate, the layer thickness was 1.08 $\mu$m.

The recording material was exposed imagewise under an original with a xenon-mercury vapor lamp, using an interference filter, to radiation of 248±10 nm and an energy of 88 mJ/cm$^2$, heated for 1 minute to 100° C. and then processed using the developer described in Example 1.

After a developing time of 90 seconds, this gave a defect-free image of the original with high flank stability, structures of <0.55 μm being resolved here in true detail.

EXAMPLE 3

A wafer produced corresponding to Example 2 was irradiated under an original with UV light from a KrF excimer laser of a wavelength of 248 nm at an energy of 108 mJ/cm$^2$. After development, an image true to the original was obtained similarly to Example 2, and structures in the sub-micron region were also reproduced in true detail therein.

EXAMPLE 4

The experiment of Example 1 was repeated, but UV light of a wavelength of 436 nm was used. An exposure energy of 135 mJ/cm$^2$ had to be used to obtain a sharp-edged image of the original.

EXAMPLE 5

A coating solution was prepared from 7.5 p.b.w. of a 1:1 copolymer of styrene and maleimide having a softening range from 165° to 180° C.,
2.5 p.b.w. of benzaldehyde bis(phenoxyethyl)acetal, prepared analogously to Preparation Example 1 of DE-A 3,730,787 which is hereby incorporated by reference, and
0.7 p.b.w. of 6-(4-chloro-styryl)-1-methanesulfonyloxy-4-methyl-2-pyridonein
42 p.b.w. of propylene glycol monomethyl ether-acetate.

The solution was filtered through a filter of 0.2 μm pore diameter and whirler-coated at 3,500 rpm onto a wafer treated with an adhesion promoter (hexamethyldisilazane). After drying at 100° C. for 1 minute on a hotplate, the layer thickness was 1.00 μm.

The recording material was exposed imagewise under an original with a xenon-mercury vapor lamp, using an interference filter, to radiation of 248±10 nm and an energy of 100 mJ/cm$^2$. The exposed material was then stored for 15 minutes at room temperature.

The recording material was developed using 0.02N aqueous tetramethylammonium hydroxide solution, the exposed areas being detached without residue within 60 seconds.

Once more, a defect-free image of the mask with satisfactorily steep resist flanks was obtained. The loss in the dark was <20 nm; structures of <0.6 μm were resolved in true detail.

EXAMPLE 6

A coating solution was prepared from
7.5 p.b.w. of a 1:1 copolymer of styrene and maleimide, having a softening range from 165° to 180° C.,
2.0 p.b.w. of 3,4-methylenedioxybenzaldehyde bis-(phenoxyethyl)-acetal and
0.8 p.b.w. of 6-cyclohexyl-1-methanesulfonyloxy-4-methyl-3-nitro-2-pyridone in
42 p.b.w. of propylene glycol monomethyl ether-acetate.

The solution was filtered through a filter of 0.2 μm pore diameter and whirler-coated at 3,200 rpm onto a wafer treated with an adhesion promoter (hexamethyldisilazane). After drying for I minute at 100° C. on the hotplate, the layer thickness was 1.06 μm.

The recording material was exposed imagewise under an original with a xenon-mercury vapor lamp, using an interference filter, to radiation of 248±10 nm and an energy of 102 mJ/cm$^2$, and heated for 90 seconds to 95° C.

The recording material was developed using 0.02N aqueous tetramethylammonium hydroxide solution, the exposed areas being detached without residue within 90 seconds and an image of the original in true detail being obtainable. The edge steepness of the image was more than 85°.

EXAMPLE 7

A coating solution was prepared from
7.5 p.b.w. of the copolymer described in Example 2,
2.5 p.b.w. of a polyorthoester, prepared by condensation of mol of 7,7-bis-hydroxymethylnonanol with mol of trimethyl orthoformate, and
0.8 p.b.w. of 1-methanesulfonyloxy-3,5-bis-methoxymethyl-4,6-dimethyl-2-pyridone in
42 p.b.w. of propylene glycol monomethyl ether-acetate.

The solution was filtered through a filter of 0.2 μm pore diameter and whirler-coated at 3,200 rpm onto a wafer treated with an adhesion promoter (hexamethyldisilazane). After drying for 1 minute at 100° C. on a hotplate the layer thickness was 0.98 μm.

The recording material was exposed imagewise under an original with a xenon-mercury vapor lamp, using an interference filter, to radiation of 248±10 nm and an energy of 67 mJ/cm$^2$, and heated to 100° C. for a further 90 seconds.

The recording material was developed using a 0.27N aqueous tetramethylammonium hydroxide solution, the exposed areas being detached within 60 seconds without leaving a residue and an image of the original in true detail being obtainable. Lines and gaps down to 0.45 μm were reproduced true to the mask.

EXAMPLE 8

A coating solution was prepared from
7.5 p.b.w. of a cresol-formaldehyde novolak having a softening range from 105° to 120° C.,
2.5 p.b.w. of an oligomeric acetal, prepared by condensation of 1 mol of benzaldehyde and 1 mol of diethylene glycol, and
0.7 p.b.w. of 1-(4-bromo-benzenesulfonyloxy)-4-methyl-6-(4-trifluoromethyl-styryl)-2-pyridone in
42 p.b.w. of propylene glycol monomethyl ether-acetate.

The solution was filtered through a filter of 0.2 μm pore diameter and whirler-coated at 3,100 rpm onto a wafer treated with an adhesion promoter (hexamethyldisilazane). After drying for 1 minute at 100° C. on a hotplate, the layer thickness was 1.05 μm.

The recording material was exposed imagewise under an original to the UV radiation of a xenon-mercury vapor lamp at 365 nm at an energy of 85 mJ/cm$^2$, then stored for 2 minutes at room temperature and subsequently heated for 90 seconds to 115° C.

The recording material was developed using the developer described in Example 1.

After a developing time of 90 seconds, a positive, defect-free image of the mask with steep, substantially vertical resist flanks was again obtained, structures of <0.6 μm also being resolved in true detail.

EXAMPLE 9

A coating solution was prepared from 7.5 p.b.w. of a styrene/p-hydroxystyrene copolymer (20/80) having a mean molecular weight of 32,000, 2.0 p.b.w. of the acetal used in Example I and 0.7 p.b.w. of 6-(2-anthracen-9-yl-vinyl)-1-methane-sulfonyloxy-4-methyl-2-pyridone in 42 p.b.w. of propylene glycol monomethyl ether-acetate The solution was filtered through a filter of 0.2 μm pore diameter and whirler-coated at 3,000 rpm onto a wafer treated with an adhesion promoter (hexamethyldisilazane). After drying for 1 minute at 100° C. on a hotplate, the layer thickness was 1.1 μm.

The recording material was exposed imagewise under an original with a xenon-mercury vapor lamp, using an interference filter, to radiation of 248±10 nm and an energy of 75 mJ/cm$^2$, stored as described in the preceding example, heat-treated and then processed using the developer described in Example 1.

After a developing time of 120 seconds, a positive defect-free image of the mask with high flank stability was obtained, structures of <0.6 μm here again being resolved in true detail.

EXAMPLES 10, 11, 12, 13A, 13B

The recording material described above was exposed to radiation of a wavelength of 365, 405, 436, 442 and 488 nm, dosages of 105, 115, 98, 95 and 125 mJ/cm$^2$ being necessary for a qualitatively perfect reproduction of the test structures down to 0.7 μm.

EXAMPLE 14

A wafer prepared according to Example 9 was irradiated under an original with UV light from a KrF excimer laser of a wavelength of 248 nm with an energy of 65 mJ/cm$^2$. The wafer was then stored for 15 minutes at room temperature and heated on a hotplate for about 45 seconds to 100° C. After development, a positive image true to the original was obtained similarly to Example 9, structures in the sub-micron range also being reproduced in true detail.

EXAMPLE 15

The experiment of Example 8 was repeated, but UV light of a wavelength of 436 nm was used. An exposure energy of 135 mJ/cm$^2$ had to be used to obtain a positive, sharp-edged image of the original.

EXAMPLE 16

A coating solution was prepared from 7.5 p.b.w. of a styrene/maleimide copolymer having a softening range from 165° to 180° C., 2.0 p.b.w. of an oligomeric N-0-acetal, prepared by reacting mol of benzaldehyde dimethylacetal and 2 mol of 2-hydroxyethyl N-propylcarbamate (see Example 1 of German Patent Application P 41 12 968.7, and hereby incorporated by reference) and 0.7 p.b.w. of 1-(4-chloro-benzenesulfonyloxy)-4,6-diphenyl-2-pyridone in 42 p.b.w. of propylene glycol monomethyl ether-acetate.

The solution was filtered through a filter of 0.2 μm pore diameter and whirler-coated at 3, 100 rpm onto a wafer treated with an adhesion promoter (hexamethyldisilazane). After drying for 1 minute at 100° C. on a the hotplate, the layer thickness was 1.05 μm.

The recording material was exposed imagewise under an original with a xenon-mercury vapor lamp, using an interference filter, to radiation of 248±10 nm and an energy of 85 mJ/cm$^2$ and then heated to 105° C. for 2 minutes.

The recording material was developed using a 0.02N aqueous tetramethylammonium hydroxide solution, the exposed areas being detached within 60 seconds without leaving a residue, while the unexposed areas showed virtually no loss.

Once more, a defect-free positive image of the mask with satisfactorily steep resist flanks was obtained. According to measurement using a layer thickness-measuring instrument made by Rudolph, the loss in bright light was <10 nm; structures of <0.55 μm were also resolved in true detail.

EXAMPLE 17

A coating solution was prepared from 10 p.b.w. of a terpolymer of 10% of pyrocatechol monomethacrylate, 70% of 2-tert.-butoxy-carbonyloxy-phenyl methacrylate and 20% of maleimide (prepared analogously to Example 11 of German Patent Application P 41 06 558.1, which is hereby incorporated by reference) and 0.3 p.b.w. of 1-(4-chloro-benzenesulfonyloxy)-4,6-diphenyl-2-pyridone in 30 p.b.w. of propylene glycol monomethyl ether-acetate.

The solution was filtered through a filter of 0.2 μm pore diameter and whirler-coated at 4,500 rpm onto a silicon wafer treated with an adhesion promoter (hexamethyldisilazane). After drying for minute at 100° C. on a hotplate, the layer thickness was 1.03 μm.

The recording material was exposed imagewise under an original with a xenon-mercury vapor lamp, using an interference filter, to radiation of 248±10 nm and an energy of 85 mJ/cm$^2$. The wafer was then heated for 1 minute at 85° C.

The recording material was developed using a 0.27N aqueous tetramethylammonium hydroxide solution, the exposed areas being detached within 60 seconds without leaving a residue, while the unexposed areas showed virtually no loss. Structures of less than <0.5 μm in the test original were resolved in true detail.

EXAMPLE 18

The recording material from Example 8 was irradiated with synchrotron radiation (BESSY, Berlin, 754 MeV) through a gold-on-silicon mask at a dosage of 225 mJ/cm$^2$. The experimental assembly is described by A. Heuberger, Microelectr. Eng., 3, 535 (1985). Development using the developer described in Example 7 and a developing time of 70 seconds gave a defect-free image of the mask down to structures of <0.4 μm. The resist flanks were virtually perpendicular to the planar substrate surface.

EXAMPLE 19

A coating solution was prepared from 9 p.b.w. of a silylated poly-4-hydroxystyrene resin having a mean molecular weight of 3,500 and a degree of silylation of 0.6 (prepared according to DE-A 3,804,533 which is hereby incorporated by reference) and 0.8 p.b.w. of 6-(4-chloro-styryl)-1-methanesulfonyloxy-4-methyl-2-pyridonein 30 p.b.w. of propylene glycol monomethyl ether-acetate.

The solution was filtered through a filter of 0.2 μm pore diameter and whirler-coated at 4,700 rpm onto a silicon wafer treated with an adhesion promoter (hexamethyldisilazane). After drying for 1 minute at 100° C. on a hotplate, the layer thickness was 1.08 μm.

The recording material was exposed imagewise under an original with a xenon-mercury vapor lamp, using an interference filter, to radiation of 248±10 nm and an energy of 45 mJ/cm$^2$. The wafer was then stored for 10 minutes at room temperature.

The recording material was developed using a 0.2N aqueous tetramethylammonium hydroxide solution, the exposed areas being detached within 60 seconds without leaving a residue, while the unexposed areas showed virtually no loss. Structures of less than <0.8 μm in the test original were resolved in true detail.

EXAMPLE 20

A coating solution was prepared from
p.b.w. of a reaction product of poly-4-hydroxy-styrene having a mean molecular weight of 6,500 and 3,4-dihydro-2H-pyran (degree of conversion 74%) and
0.8 p.b.w. of 1-methanesulfonyloxy-3,5-bis-methoxymethyl-4,6-dimethyl-2-pyridone in
30 p.b.w. of propylene glycol monomethyl ether-acetate.

The solution was filtered through a filter of 0.2 μm pore diameter and whirler-coated at 4,200 rpm onto a silicon wafer treated with an adhesion promoter (hexamethyldisilazane). After drying for minute at 100° C. on a hotplate, the layer thickness was 0.98 μm.

The recording material was exposed imagewise under an original with a xenon-mercury vapor lamp, using an interference filter, to radiation of 248±10 nm and an energy of 55 mJ/cm$^2$. The wafer was then heated for minute to 100° C.

The recording material was developed using a 0.2N aqueous tetramethylammonium hydroxide solution, the exposed areas being detached within 60 seconds without leaving a residue, while the unexposed areas showed virtually no loss. Structures of less than <0.6 μm in the test original were resolved in true detail.

EXAMPLES 21 AND 22 (COMPARISON EXAMPLES)

The resist formulation of Example 9 was modified in such a way that the acid-generating compound used there was replaced by the same quantity of triphenylsulfonium hexafluorophosphate (Example 21) or 2-nitrobenzyl tosylate (Example 22). After exposure, using an interference filter, to radiation of 248±10 nm and an energy of 65 and 95 mJ/cm$^2$ respectively, and development in a developer of the composition indicated in Example 1, structures were obtained which showed no image differentiation suitable for practice.

When the onium salt was used (Example 21), structures having a so-called "coating foot" were obtained. That is residues of the resist adhered to the substrate in the exposed areas. When the tosyl ester was used (Example 22), surface crosslinkings ("lips") were visible which partially overlapped the bared substrate surfaces. In both cases, acceptable structuring was thus not obtainable. No image differentiation was achieved in either case with exposure to radiation of a wavelength of 436 nm.

EXAMPLE 23

For producing an offset printing plate, a mechanically roughened and pretreated aluminum foil was whirler-coated with a coating solution of the following composition:
7.5 p.b.w. of a cresol-formaldehyde novolak having a softening range from 105° to 120° C.,
2.3 p.b.w. of a polyacetal prepared from i mol of 2-ethylbutyraldehyde and mol of triethylene glycol,
0.5 p.b.w. of 6-(4-chloro-styryl)-1-methanesulfonyloxy-4-methyl-2-pyridone and
0.05 p.b.w. of crystal violet base in
90 p.b.w. of propylene glycol monomethyl ether-acetate.

After the layer was dried (layer weight about 2.5 g/cm$^2$), it was exposed under a positive test original for 30 seconds, stored for 20 minutes and developed using a developer of the following composition:
0.5 p.b.w. of sodium hydroxide,
0.8 p.b.w. of sodium metasilicate x 9 H$_2$O,
1.0 p.b.w. of 2-n-butoxyethanol in
97.7 p.b.w. of deionized water.

After rinsing with water, the plate was made ready for printing by wiping with 1%; phosphoric acid. After clamping into a printing press, 62,000 perfect prints were obtained.

EXAMPLE 24

The solution of a dry etch- and positive electroplating-resist was produced by preparing the following composition:
12.5 p.b.w. of the novolak described in Example 1,
10.0 p.b.w. of an oligomeric aliphatic polyacetal having a mean molecular weight of about 1,400, prepared by condensation of butyraldehyde with diethylene glycol,
0.5 p.b.w. of 6-(4-methoxy-styryl)-4-methyl-1-(4-nitrobenzenesulfonyloxy)-2-pyridone and
0.1 p.b.w. of crystal violet in
30 p.b.w. of butanone.

A 25 μm thick polyethylene terephthalate film usual for this purpose was coated with this solution to give a dry layer thickness of 18 μm. The surface of the dry resist film was laminated to an additional polyethylene terephthalate film. After peeling off the cover film, the dry film was laminated under pressure and heat to a brass plate. After cooling and peeling off the support film, the plate was exposed through an original, good image contrast being visible after short heating. The exposed areas were spray-developed using a developer of the composition indicated in Example 1. The plate was then etched through to the smooth flanks, using a commercially available iron(III) chloride solution. The milled products obtained can be yet further processed before they are separated.

EXAMPLE 25 TO 75

Analogously to Example 9, coating solutions were prepared in which the acid-generating compound was replaced by the same quantity of another 1-sulfonyloxy-2-pyridone according to the invention, marked below by its compound number. The coating solutions were whirler-coated, as described in Example 9, onto aluminum sheets to give a dry layer thickness of about 2.0 μm and then exposed to radiation of different wavelengths (248±10 nm 365±5 nm, 436±5 nm) through a gray wedge mask having 15 steps and a density difference of 0.15 per step. The exposed sheets were then heated to 100° C. for 1 minute and subsequently developed using the developer described in Example 1. During the development, the mixture was not attacked by the developer in the areas which correspond to the wedge steps of lower exposure dosage, whereas complete detachment of the film occurred in the case of larger exposure dosages. The highest number of steps, corresponding to the wedge step which has remained imagewise and has not been completely detached by the developer, was then evaluated as a measure of the sensitivity. Higher step numbers signify a higher sensitivity. The results are summarized in Table II below.

TABLE I

| COMPOUND NUMBER | COMPOUND NAME |
|---|---|
| 1 | 1-(4-fluorobenzenesulfonyloxy)-3,4,6-trimethyl-2-pyridone |
| 2 | 6-(4-chloro-styryl)-1-methanesulfonyloxy-4-methyl-2-pyridone |
| 3 | 1-(4-chloro-benzenesulfonyloxy)-4,6-diphenyl-2-pyridone |
| 4 | 6-cyclohexyl-1-methanesulfonyloxy-4-methyl-3-nitro-2-pyridone |
| 5 | 1-methanesulfonyloxy-3,5-bis-methoxymethyl-4,6-dimethyl-2-pyridone |
| 6 | 3-cyano-1-methanesulfonyloxy-4,6-dimethyl-2-pyridone |
| 7 | 6-isopropyl-1-methanesulfonyloxy-4-methyl-2-pyridone |
| 8 | 6-(2,2-diphenyl-vinyl)-1-methanesulfonyloxy-4-methyl-2-pyridone |
| 9 | 6-(2-anthracen-9-yl-vinyl)-1-methanesulfonyloxy-4-methyl-2-pyridone |
| 10 | 1-(4-bromobenzene sulfonyloxy)-4-methyl-6-(4-trifluoromethyl-styryl)-2-pyridone |
| 11 | 1-methanesulfonyloxy-4-methyl-6-(4-nitrophenyl)2-pyridone |
| 12 | 1-benzenesulfonyloxy-6-isopropyl-4-methyl-2-pyridone |
| 13 | 1-ethanesulfonyloxy-6-(4-methoxyphenyl)-4-methyl-2-pyridone |
| 14 | 6-(3-chloro-4-methoxyphenyl)-4-methyl-1-(4-nitrobenzenesulfonyloxy)-2-pyridone |
| 15 | 1-methanesulfonyloxy-4-methyl-3-methylmercapto-6-phenyl-2-pyridone |
| 16 | 1-benzenesulfonyloxy-6-butyl-4-methyl-5-nitro-2-pyridone |
| 17 | 1-butanesulfonyloxy-4-propyl-6-p-tolyl-2-pyridone |
| 18 | 3-bromo-6-(3,4-dichlorophenyl)-4-methyl-1-(toluene-4-sulfonyloxy)-2-pyridone |
| 19 | 1-methanesulfonyloxy-4-methyl-6-[1]naphthyl-2-pyridone |
| 20 | 5-cyano-6-cyclohexyl-1-[4-(2-methoxyethoxy)-benzenesulfonyloxy]-4-methyl-2-pyridone |
| 21 | 6-(4-benzyloxyphenyl)-4-ethyl-3-phenylmercaptol-trifluoromethanesulfonyloxy-2-pyridone |
| 22 | 3,5-dibromo-1-(4-fluorobenzenesulfonyloxy)-4-methyl-6-(2,4,5-trichlorophenyl)-2-pyridone |
| 23 | 1-methanesulfonyloxy-4,6-dimethyl-2-pyridone |
| 24 | 6-cyclohexyl-1-(3,4-dichlorobenzenesulfonyloxy)-4-methyl-3-phenyl-2-pyridone |
| 25 | 4-ethyl-6-[2]naphthyl-1-trifluoromethanesulfonyloxy-2-pyridone |
| 26 | 3-bromo-1-(4-carboxybenzenesulfonyloxy)-6-(3,4-dimethoxyphenyl)-4-methyl-2-pyridone |
| 27 | 5-ethanesulfonyloxy-4-methyl-2,3-dihydro-1H-cyclopenta[c]pyridine-6-one |
| 28 | 3-allyl-1-benzenesulfonyloxy-4-methyl-6-phenyl-2-pyridone |
| 29 | 6-benzhydryl-4-methyl-1-trifluoromethanesulfonyloxy-2-pyridone |
| 30 | 3-bromo-1-(4-methoxybenzenesulfonyloxy)-4-methyl-6-[2]norbornyl-2-pyridone |
| 31 | 5-allyl-4-methyl-6-phenyl-1-trifluoromethanesulfonyloxy-2-pyridone |
| 32 | 4-methyl-6-phenyl-5-prop-2-ynyl-1-(toluene-4-sulfonyloxy)-2-pyridone |
| 33 | 6-(2-ethylpentyl)-1-(1,1,2,3,3,3-hexafluoropropanesulfonyloxy)-4-methyl-2-pyridone |
| 34 | 4-methyl-6-phenethyl-1-(4-trifluoromethylbenzene-sulfonyloxy)-2-pyridone |
| 35 | 6-(3-chloro-4-methoxystyryl)-1-(4-nitro-benzenesulfonyloxy)-4-phenyl-2-pyridone |
| 36 | 4-butyl-6-(3,4-dimethoxystyryl)-1-(4-methoxybenzenesulfonyloxy)-2-pyridone |
| 37 | 6-[2,2-bis-(4-methoxyphenyl)-vinyl]-4-methyl-1-(toluene-4-sulfonyloxy)-2-pyridone |
| 38 | 1-methanesulfonyloxy-4-methyl-6-(4-styryl-styryl)2-pyridone |
| 39 | 1-benzenesulfonyloxy-6-[2-(10,11-dihydro-5H-dibenzo-[a,d]cycloheptene-5-yl)-vinyl]-4-methyl-2-pyridone |
| 40 | 1-methanesulfonyloxy-4-methyl-6-(6-phenyl-hexa-1,3,5-trienyl)-2-pyridone |
| 41 | 6-(4-fluoro-styryl)-1-methanesulfonyloxy-4-methyl-2-pyridone |
| 42 | 1-benzenesulfonyloxy-4-methyl-6-styryl-2-pyridone |
| 43 | 6-(3,4-dimethoxystyryl)-1-ethanesulfonyloxy-4-methyl-2-pyridone |
| 44 | 6-(4-methoxystyryl)-4-methyl-1-(4-nitro-benzenesulfonyloxy)-2-pyridone |
| 45 | 6-(4-cyanostyryl)-4-methyl-1-trifluoromethanesulfonyloxy-2-pyridone |
| 46 | 6-(3-benzyloxystyryl)-1-(4-chlorobenzenesulfonyloxy)-4-methyl-2-pyridone |
| 47 | 1-butanesulfonyloxy-6-(3,4-dichlorostyryl)-4-methyl-2-pyridone |
| 48 | 1-(4-chloro-3-nitrobenzenesulfonyloxy)-6-(5-ethoxy-2-methoxystyryl)-4-methyl-2-pyridone |
| 49 | 1-(4-bromobenzenesulfonyloxy)-6-(3-chloro-4-methyl-styryl)-4-methyl-2-pyridone |
| 50 | 6-(4-benzyloxy-3-methoxystyryl)-1-(4-chloro-benzene-sulfonyloxy)-4-methyl-2-pyridone |
| 51 | 1-isopropanesulfonyloxy-4-methyl-6-(4-phenyl-butal,3-dienyl)-2-pyridone |
| 52 | 4-methyl-6-(2-[1]naphthyl-vinyl)-1-(4-nitro-benzene-sulfonyloxy)-2-pyridone |
| 53 | 6-[4-(2-ethoxy-ethoxy)-styryl]-1-methanesulfonyloxy-4-methyl-2-pyridone |
| 54 | 6-(2,4-dimethoxy-3-methylstyryl)-4-methyl-1-(toluene-4-sulfonyloxy)-2-pyridone |
| 55 | 4-methyl-6-styryl-1-trichloromethanesulfonyloxy-2-pyridone |
| 56 | 4-methyl-6-(2-[2]naphthyl-vinyl)-1-(toluene-4-sulfonyloxy)-2-pyridone |
| 57 | 4-cyclohexyl-6-(4-methoxy-styryl)-1-methanesulfonyloxy-2-pyridone |
| 58 | 3-cyano-6-(3,4-dimethylstyryl)-4-methyl-1-(toluene-4-sulfonyloxy)-2-pyridone |
| 59 | 6-[2-(4-chlorophenyl)-propenyl]-1-methanesulfonyloxy-4-methyl-2-pyridone |
| 60 | 6-(3-chloro-4-methoxystyryl)-4-phenyl-1-(4-nitro-benzensulfonyloxy)-2-pyridone |
| 61 | 4-butyl-6-(3,4-dimethoxystyryl)-1-(4-methoxy-benzenesulfonyloxy)-2-pyridone |
| 62 | 6-[2,2-bis-(4-methoxyphenyl)-vinyl]-4-methyl-1-(toluene-4-sulfonyloxy)-2-pyridone |
| 63 | 6-(2-anthracen-9-yl-vinyl)-4-methyl-1-(toluene-4-sulfonyloxy)-2-pyridone |
| 64 | 1-benzenesulfonyloxy-5-chloro-4-ethyl-6-(4-methoxy-styryl)-2-pyridone |
| 65 | 4-methyl-3-nitro-6-(2-thiophen-2-yl-vinyl)1-(toluene-4-sulfonyloxy)-2-pyridone |
| 66 | 3-butylmercapto-1-methanesulfonyloxy-6-(4-methoxystyryl)-4-methyl-2-pyridone |
| 67 | 3,5-dibromo-4-methyl-6-(3-methylstyryl)-1-(toluene-4-sulfonyloxy)-2-pyridone |
| 68 | 1-ethanesulfonyloxy-3-methoxymethy-1-4-methyl-6-(2-[2]naphthyl-vinyl)-2-pyridone |
| 69 | 3,5-dichloro-6-[2-(6-methoxy-[2]naphthyl)-vinyl]-4-methyl-1-(toluene-4-sulfonyloxy)-2-pyridone |
| 70 | 1-methanesulfonyloxy-4-methyl-6-(2-[1]naphthyl-vinyl)-2-pyridone |
| 71 | 6-(4-dimethylamino-styryl)-1-methanesulfonyloxy-4-methyl-2-pyridone |
| 72 | 6-(2-benzofuran-2-yl-vinyl)-3-methoxymethyl-4-methyl-1-(toluene-4-sulfonyloxy)-2-pyridone |
| 73 | 6-[2-(5-bromothiophene-2-vl)-vinyl]-3,5-dichloro-4-methyl-1-(trifluoromethylbenzenesulfonyloxy)2-pyridone |
| 74 | 1-methanesulfonyloxy-4-methyl-6-(4-phenyl- |

TABLE I-continued

| COMPOUND NUMBER | COMPOUND NAME |
|---|---|
| | styryl)-2-pyridone |
| 75 | 1-benzenesulfonyloxy-3-bromo-6-[4-(4-chlorophenoxy)-styryl]-4-methyl-2-pyridone |
| 76 | 6-[4-(4-chlorophenylmercapto)-styryl]1-(4-fluorobenzenesulfonyloxy)-4-methyl-2-pyridone |
| 77 | 6-[4-(4-chlorobenzyloxy)-styryl]-1-(4-isopropyl-benzensulfonyloxy)-4-methyl-2-pyridone |
| 78 | 6-(4-chloro-3-trifluoromethyl-styryl)-1(1,1,2,3,3,3-hexafluoropropanesulfonyloxy)-4-methyl-2-pyridone |
| 79 | 1-benzenesulfonyloxy-6-(4-dimethylaminostyryl)4-methyl-2-pyridone |
| 80 | 6-(4-allyloxy)-styryl]-1-methanesulfonyloxy4-methyl-2-pyridone |
| 81 | 6-(3,5-dichloro-4-hexyloxystyryl)-4-methyl-1-propanesulfonyloxy-2-pyridone |
| 82 | 4-methyl-6-(2-phenyl-2-cyclohexylvinyl)-1-(toluene-4-sulfonyloxy)-2-pyridone |
| 83 | 1-(4-methoxy-benzenesulfonyloxy)-4-methyl-6-(2-phenyl-hex-1-enyl)-2-pyridone |
| 84 | 3-bromo-6-(2-cyclohexylvinyl)4-methyl-1-trifluoromethanesulfonyloxy-2-pyridone |
| 85 | 4-ethyl-1-methanesulfonyloxy-6-pent-1-enyl-2-pyridone |
| 86 | 1-methanesulfonyloxy-4-methyl-6-2-methylprop-1-enyl)-2-pyridone |
| 87 | 6-cyclooctylidenemethyl-1-methanesulfonyloxy-4-methyl-2-pyridone |
| 88 | 6-cyclopentylidenemethyl-4-methyl-1-(toluene-4-sulfonyloxy)-2-pyridone |
| 89 | 6-[2-(5-bromo-thiophen-2-yl]-vinyl]-3-methanesulfonylamino-1-methanesulfonyloxy-4-methyl-2-pyridone |
| 90 | 6-[2-(5-bromo-thiophen-2-yl)-vinyl]-3-isobutyryl-amino-4-methyl-1-(toluene-4-sulfonyloxy)-2-pyridone |
| 91 | 1-ethanesulfonyloxy-6-(2-methyl-6-phenyl-hexa-1,3,5-trienyl)-4-methyl-2-pyridone |
| 92 | 6-(4-cyclohexyloxy-styryl)-1-(1,1,2,3,3,3-hexa-fluoropropanesulfonyloxy)-4-methyl-2-pyridone |
| 93 | 6-(3-cyclopropyloxy-styryl)-1-methanesulfonyloxy-4-methyl-2-pyridone |
| 94 | 6-(2-benzofuran-2-yl-vinyl)-4-methyl-1-(toluene-4-sulfonyloxy)-2-pyridone |
| 95 | 6-[2-(5-bromothiophen-2-yl)-vinyl]-4-methyl-1-(3-trifluoromethylbenzenesulfonyloxy)-2-pyridone |
| 96 | 4-methyl-6-[2-(5-methylfuran-2-yl)-vinyl]-1-(naphthalen-2-ylsulfonyloxy)-2-pyridone |
| 97 | 4-methyl-6-(4-nitrostyryl)-1-octanesulfonyloxy-2-pyridone |
| 98 | 1-hexadecanesulfonyloxy-4-methyl-6-(4-nitrostyryl)2-pyridone |
| 99 | 1-methanesulfonyloxy-4-methyl-6-(4-nitrostyryl)2-pyridone |
| 100 | 6-(2,2-dithiophen-2-yl-vinyl)-1-methanesulfonyloxy-4-methyl-2-pyridone |
| 101 | 3-cyano-6-(2,4-dimethoxystyryl)-4-methyl-1-trifluoromethanesulfonyloxy-2-pyridone |
| 102 | 6-(2-benzofuran-2-yl-vinyl)-4-methyl-3-thio-cyanato-1-(toluene-4-sulfonyloxy)-2-pyridone |
| 103 | 6-(2-benzofuran-2-yl-vinyl)-3-bromo-1-methane-sulfonyloxy-4-methyl-2-pyridone |
| 104 | 3,5-bis-isopropylmercaptomethyl-4-methyl-1-(4-nitro-benzenesulfonyloxy)-6-styryl-2-pyridone |
| 105 | 1-(4-methoxybenzenesulfonyloxy)-4-methyl-6-(2,3,4,5,6-pentafluorostyryl)-2-pyridone |
| 106 | 6-(3,5-dichloro-2,4,6-trimethoxystyryl)-4-methyl-1-(1-trifluoromethyl-2,2,2-trifluoroethane-sulfonyloxy)-2-pyridone |
| 107 | 6-(3-bromo-2,4,6-trimethoxy-styryl)-1-methane-sulfonyloxy-4-methyl-2-pyridone |
| 108 | 6-(2-ferrocenylvinyl)-4-methyl-1-(toluene-4-sulfonyloxy)-2-pyridone |
| 109 | 6-[2-(5-methylfuran-2-yl)-vinyl]-4-methyl-3-nitro-1-(toluene-4-sulfonyloxy)-2-pyridone 110) 6-(4-tert.-butyl-styryl)-4-methyl-5-nitro-1-propane-sulfonyloxy-2-pyridone |
| 111 | 3,5-dinitro-6-(4-tert.-butyl-styryl)-4-methyl-1-butanesulfonyloxy-2-pyridone |
| 112 | 1-benzenesulfonyloxy-3-bromo-6-(4-butoxy-styryl)-4-methyl-5-nitro-2-pyridone |
| 113 | 1-(4-bromo-benzenesulfonyloxy)-4-methyl-6-(4-trifluoromethylstyryl)-2-pyridone |
| 114 | 6-(3-chloro-5-phenyl-buta-1,3-dienyl)-1-isopropanesulfonyloxy-4-methyl-2-pyridone |
| 115 | 1-benzenesulfonyloxy-4-methyl-6-[2-(1-benzene-sulfonyl-pyrrol-2-yl)-vinyl]-2-pyridone |
| 116 | 6-(10,11-dihydro-dibenzo[a,d]cyclohept-5-ylidene-methyl)-4-methyl-1-(2-thiophen-2-ylsulfonyloxy)-2-pyridone |
| 117 | 1-benzenesulfonyloxy-4-methyl-6-(4-styryl-styryl)-2-pyridone |
| 118 | 1-methanesulfonyloxy-4-methyl-6-(2-[1]naphthyl-vinyl)-2-pyridone |
| 119 | 1-methanesulfonyloxy-4-methyl-6-(4-phenyl-buta-1,3-dienyl)-2-pyridone |
| 120 | 6-(4-dimethylaminostyryl)-1-methanesulfonyloxy-4-methyl-2-pyridone |
| 121 | 1-methanesulfonyloxy-6-(4-methoxy-styryl)-4-methyl-2-pyridone |
| 122 | 1-(4-chloro-benzenesulfonyloxy)-6-(4-methoxy-styryl)-4-methyl-2-pyridone |
| 123 | 1-(4-chloro-benzenesulfonyloxy)-6-(4-chloro-styryl)-4-methyl-2-pyridone |
| 124 | 1-ethanesulfonyloxy-6-(4-methoxystyryl)-4-methyl-2-pyridone |
| 125 | 4-bromo-1-methanesulfonyloxy-6-(4-methoxy-styryl)-4-methyl-2-pyridone |
| 126 | 1-isopropanesulfonyloxy-6-4-methoxystyryl)-4-methyl-2-pyridone |
| 127 | 1-butanesulfonyloxy-6-(4-methoxystyryl)-4-methyl-2-pyridone |
| 128 | 6-(4-methoxystyryl)-4-methyl-1-trifluoromethane-sulfonyloxy-2-pyridone |
| 129 | 6-(4-methoxystyryl)-(1,1,2,3,3,3-hexafluoro-propanesulfonyloxy)-4-methyl-2-pyridone |
| 130 | 6-(4-methoxystyryl)-4-methyl-1-benzenesul-fonyloxy-2-pyridone |
| 131 | 1-(4-fluoro-benzenesulfonyloxy)-6-(4-methoxy-styryl)-4-methyl-2-pyridone |
| 132 | 6-(4-methoxystyryl)-4-methyl-1-(4-trifluoro-benzenesulfonyloxy)-2-pyridone |
| 133 | 1-benzenesulfonyloxy-6-(4-methoxystyryl)-4-methyl-2-pyridone |
| 134 | 6-(4-chlorostyryl)-1-ethanesulfonyloxy-4-methyl-2-pyridone |
| 135 | 3-bromo-6-(4-chlorostyryl)-1-methanesul-fonyloxy-4-methyl-2-pyridone |
| 136 | 6-(4-chloro-styryl)-1-isopropanesulfonyloxy-4-methyl-2-pyridone |
| 137 | 1-butanesulfonyloxy-6-(4-chlorostyryl-4-methyl-2-pyridone |
| 138 | 6-(4-chlorostyryl)-4-methyl-1-trifluoromethane-sulfonyloxy-2-pyridone |
| 139 | 6-(4-chlorostyryl)-1-(1,1,2,3,3,3-hexafluoro-propanesulfonyloxy)-4-methyl-2-pyridone |
| 140 | 1-benzenesulfonyloxy-6-(4-chlorostyryl)-4-methyl-2-pyridone |
| 141 | 6-(4-chlorostyryl)-1-(4-fluorobenzenesul-fonyloxy)-4-methyl-2-pyridone |
| 142 | 6-(4-chlorostyryl)-4-methyl-1-(4-trifluoromethyl-benzenesulfonyloxy)-2-pyridone |
| 143 | 1-benzenesulfonyloxy-6-(4-chlorostyryl-4-methyl-2-pyridone |
| 144 | 1,4-bis-(4-methyl-2-oxo-6-styryl-2H-pyridin-1-yloxysulfonyl)-butane |
| 145 | 1,3-bis-[6-(4-methoxy-styryl)-4-methyl-2-oxo-2H-pyridin-1-yloxysulfonyl]-benzene |
| 146 | 1,3-bis-[3-bromo-6-(4-chlorostyryl)-4-methyl-2-oxo-2H-pyridin-1-yloxysulfonyl]-2,4,6-trimethyl-benzene |
| 147 | 1,5-bis-[6-(4-fluorostyryl)-4-methyl-2-oxo-2H-pyridin-1-yloxysulfonyl]-naphthalene |
| 148 | 2-chloro-3,5-bis-[methyl-6-(4-methylstyryl)-2-oxo-2H-pyridin-1-yloxysulfonyl]-thiophene |
| 149 | 1-methanesulfonyloxy-2-pyridone |
| 150 | 1-benzenesulfonyloxy-4-methyl-3-thiocyanato-6-(2,4,4-trimethyl-pentyl)-2-pyridone |
| 151 | 6-cyclohexyl-3-methanesulfonylamino-1-methane-sulfonyloxy-4-methyl-2-pyridone |

TABLE I-continued

| COMPOUND NUMBER | COMPOUND NAME |
|---|---|
| 152 | 3-acetylamino-4-methyl-1-(naphthalen-2-ylsulfonyloxy)-6-phenyl-2-pyridone |
| 153 | 1-methanesulfonyloxy-4-methyl-6-phenyl-2-pyridone |
| 154 | 5-chloro-3,4,6-trimethyl-1-(thiophen-2-ylsulfonyloxy)-2-pyridone |
| 155 | 1-methanesulfonyloxy-4,6-diphenyl-2-pyridone |
| 156 | 1-(4-chlorobenzenesulfonyloxy)-6-cyclohexy-1-4-methyl-2-pyridone |
| 157 | 1-(4-isopropylbenzenesulfonyloxy)-4-methyl-6-undecy-1-2-pyridone |
| 158 | 1-methanesulfonyloxy-4-methyl-6-(2,3,3-trimethyl-butyl)-2-pyridone |
| 159 | 1-(2-chloro-5-nitro-benzenesulfonyloxy)-4-methyl-6-(2,4,6-trichlorophenoxymethyl)-2-pyridone |
| 160 | 6-(4-chlorobenzyl)-1-(3-chloro-4-methoxy-benzenesulfonyloxy)-4-methyl-2-pyridone |
| 161 | 1-methanesulfonyloxy-4,5,6-triphenyl-2-pyridone |
| 162 | 6-(2,4-dichlorophenyl)-1-methanesulfonyloxy-4-methyl-2-pyridone |
| 163 | 6-(2-cyclohexylethyl)-4-methyl-1-pentafluorobenzene-sulfonyloxy-2-pyridone |
| 164 | 1-(4-bromobenzenesulfonyloxy)-4-methyl-6-[2]norbornyl-2-pyridone |
| 165 | 3-ethyl-1-methanesulfonyloxy-4-methyl-6-p-tolyl-2-pyridone |
| 166 | 1-benzenesulfonyloxy-3,5-diiodo-4,6-dimethyl-2-pyridone |
| 167 | 1,3-bis-(4-methyl-2-oxo-2H-pyridin-1-yloxysulfonyl)-4,6-dichlorobenzene |
| 168 | 6-(2,4-dichlorobenzyl)-4-methyl-3,5-dinitro-1-(toluene-4-sulfonyloxy)-2-pyridone |
| 169 | 1,3-bis-(6-cyclohexyl-4-methyl-2-oxo-2H-pyridin-1-yloxysulfonyl)-2,4,6-trimethylbenzene |
| 170 | 1,4-bis-(4-methyl-2-oxo-6-phenyl-2H-pyridin-1-yloxysulfonyl)-butane |

TABLE II

| Example | Compound | Measured figures for film detachment after irradiation | | |
|---|---|---|---|---|
| | | 248 nm | 365 nm | 436 nm |
| 25 | none | 0 | 0 | 0 |
| 26 | 1 | 8 | 3 | 0 |
| 27 | 2 | 8 | 9 | 10 |
| 28 | 3 | 7 | 5 | 0 |
| 29 | 4 | 8 | 2 | 0 |
| 30 | 5 | 6 | 1 | 0 |
| 31 | 6 | 6 | 1 | 0 |
| 32 | 7 | 6 | 1 | 0 |
| 33 | 8 | 8 | 8 | 5 |
| 34 | 9 | 7 | 7 | 12 |
| 35 | 10 | 8 | 11 | 8 |
| 36 | 12 | 8 | 8 | 1 |
| 37 | 14 | 8 | 10 | 3 |
| 38 | 16 | 5 | 6 | 0 |
| 39 | 18 | 9 | 5 | 0 |
| 40 | 19 | 8 | 11 | 5 |
| 41 | 21 | 11 | 5 | 1 |
| 42 | 23 | 9 | 6 | 0 |
| 43 | 24 | 9 | 5 | 0 |
| 44 | 25 | 12 | 9 | 3 |
| 45 | 27 | 8 | 3 | 0 |
| 46 | 29 | 8 | 6 | 1 |
| 47 | 30 | 8 | 6 | 2 |
| 48 | 31 | 8 | 5 | 5 |
| 49 | 32 | 6 | 3 | 0 |
| 50 | 35 | 9 | 12 | 10 |
| 51 | 37 | 8 | 11 | 6 |
| 52 | 38 | 9 | 12 | 12 |
| 53 | 39 | 7 | 7 | 6 |
| 54 | 40 | 5 | 5 | 8 |
| 55 | 43 | 11 | 14 | 12 |
| 56 | 45 | 9 | 12 | 8 |
| 57 | 47 | 10 | 10 | 7 |
| 58 | 49 | 8 | 8 | 6 |
| 59 | 50 | 10 | 12 | 9 |
| 60 | 51 | 10 | 11 | 13 |
| 61 | 52 | 8 | 11 | 12 |
| 62 | 54 | 9 | 10 | 10 |
| 63 | 56 | 8 | 11 | 11 |
| 64 | 58 | 7 | 9 | 11 |
| 65 | 60 | 9 | 11 | 11 |
| 66 | 62 | 8 | 8 | 7 |
| 67 | 63 | 7 | 7 | 13 |
| 68 | 65 | 8 | 8 | 10 |
| 69 | 66 | 9 | 12 | 9 |
| 70 | 67 | 6 | 9 | 7 |
| 71 | 69 | 8 | 12 | 12 |
| 72 | 71 | 5 | 6 | 6 |
| 73 | 72 | 7 | 9 | 9 |
| 74 | 74 | 10 | 10 | 8 |
| 75 | 76 | 11 | 12 | 10 |

What is claimed is:

1. A positive-working radiation-sensitive mixture comprising
a) at least one compound which generates a strong acid under the action of actinic radiation,
b) at least one compound having at least one C—O—C or C—O—Si bond cleavable by acid and
c) at least one polymeric binder which is insoluble in water and soluble or at least swellable in aqueous alkaline solutions, wherein the compound a) comprises a 1-sulfonyloxy-2-pyridone of the formula (I)

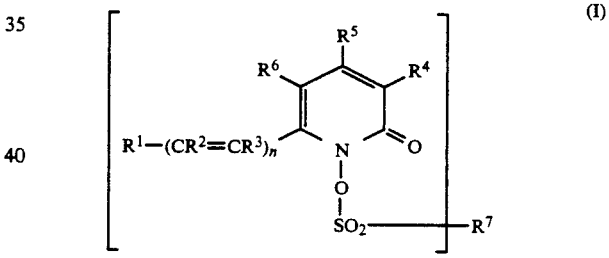

in which
$R^1$ is a hydrogen atom or an alkyl, cycloalkyl, aryl, aralkenyl, heteroaryl or heteroaralkenyl radical,
$R^2$ is hydrogen, chlorine, bromine or an alkyl, cycloalkyl, aryl or heteroaryl radical, or
$R^1$ and $R^2$ together form a five- to eight-membered ring,
$R^3$ is hydrogen or an alkyl radical,
$R^4$ is hydrogen, halogen, nitro, acylamino, cyano, thiocyanato or an alkyl, alkenyl, alkynyl, aryl, aralkyl, alkylthio, arylthio or cycloalkylthio radical,
$R^5$ is hydrogen or an alkyl or aryl radical or
$R^4$ and $R^5$ together form a five- to eight-membered ring,
$R^6$ is hydrogen, halogen, nitro, acylamino, cyano, thiocyanato or an alkyl, alkenyl, alkoxyalkyl, aryl, aralkyl, alkylthio, cycloalkylthio or arylthio radical,
$R^7$ is an alkyl, cycloalkyl, perfluorinated or highly fluorinated alkyl, aryl, arylalkyl, heteroaryl, alkylene or arylene radical,
m is 1 or 2, and
n is 0, 1, 2, or 3.

2. A positive-working radiation-sensitive mixture as claimed in claim 1, wherein $R^1$ is an alkyl or cycloalkyl radical, or heterocyclic radical or an aryl radical of the formula II

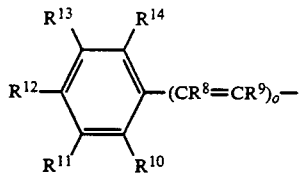

in which $R^8$ and $R^9$ are identical or different and are hydrogen or alkyl or aryl group, $R^{10}$ to $R^{14}$ are identical or different and are hydrogen, an alkyl, alkenyl, alkoxy, alkylthio or alkanesulfonyl radical each having up to 6 carbon atoms, a cycloalkyloxy, cycloalkylthioorcycloalkanesulfonyl radical each having up to 8 carbon atoms, a phenyl, styryl, phenoxy, phenylthio, benzenesulfonyl, phenylalkoxy, phenylalkylthio or phenylalkanesulfonyl radical which may be substituted on the aromatic ring and has up to 3 carbon atoms in the alkyl chain, hydroxy, halogen, trifluoromethyl, nitro, cyano, alkoxycarbonyl, carbamoyl which may be substituted on the nitrogen by one or two alkyl radicals which may be linked to form a 5- to 7-membered ring, sulfamoyl which may be substituted on the nitrogen by one or two alkyl radicals which may be linked to form a 5- to 7-membered ring, alkanesulfonyloxy, arylsulfonyloxy, acylamino, alkylamino or arylamino, or two mutually adjacent substituents $R^{10}$ to $R^{14}$ form one or two further fused rings, and o is 0 or 1.

3. A positive-working radiation-sensitive mixture as claimed in claim 2, wherein $R^1$ is a 5- or 6-membered heterocyclic ring having up to three heteroatoms, of the formula III

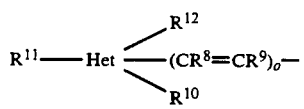

wherein $R^8$ to $R^{12}$ and o are as defined for formula II.

4. A positive-working radiation-sensitive mixture as claimed in claim 1, wherein $R^1$ is a ferrocenyl radical and $R^2$ is hydrogen, chlorine, bromine, alkyl, cycloalkyl or a radical of the formulae

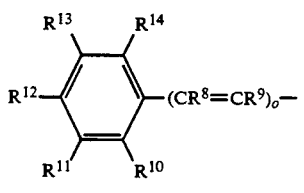

or

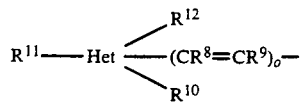

wherein $R^8$ and $R^9$ are identical or different and are hydrogen or an alkyl or aryl group, $R^{10}$ to $R^{14}$ are identical or different and are hydrogen, an alkyl, alkenyl, alkoxy, alkylthio or alkanesulfonyl radical each having up to 6 carbon atoms, a cycloalkyloxy, cycloalkylthioorcycloalkanesulfonyl radical each having up to 8 carbon atoms, a phenyl, styryl, phenoxy, phenylthio, benzenesulfonyl, phenylalkoxy, phenylalkylthio or phenylalkanesulfonyl radical which may be substituted on the aromatic ring and has up to 3 carbon atoms in the alkyl chain, hydroxy, halogen, trifluoromethyl, nitro, cyano, alkoxycarbonyl, carbamoyl which may be substituted on the nitrogen by one or two alkyl radicals which may be linked to form a 5- to 7-membered ring, sulfamoyl which may be substituted on the nitrogen by one or two alkyl radicals which may be linked to form a 5- to 7-membered ring, alkanesulfonyloxy, arylsulfonyloxy, acylamino, alkylamino or arylamino, or two mutually adjacent substituents $R^{10}$ to $R^{14}$ form one or two further fused rings, and o is 0 or 1; or $R^1$ and $R^2$ together form a five- to eight-membered ring, $R^3$ is hydrogen or an alkyl radical, $R^4$ is hydrogen, halogen, nitro, acylamino, cyano, thiocyanato or an alkyl, aryl, alkylthio, arylthio or cycloalkylthio radical, $R^5$ is hydrogen or an alkyl or aryl radical or $R^4$ and $R^5$ together form a five- to eight-membered ring, $R^6$ is hydrogen, halogen, nitro, acylamino, cyano, thiocyanato or an alkyl, aryl, alkylthio, arylthio or cycloalkylthio radical, $R^7$ is an alkyl, cycloalkyl, perfluorinated or highly fluorinated alkyl, an aryl, arylalkyl, heteroaryl, alkylene, or arylene radical, and n is 0, 1, 2, or 3 and m is 1 or 2.

5. A positive-working radiation-sensitive mixture as claimed in claim 1, wherein $R^7$ is an alkyl radical having 1 to 4 carbon atoms, a highly fluorinated or perfluorinated alkyl radical having 1 to 4 carbon atoms or an aryl radical of the formula IV

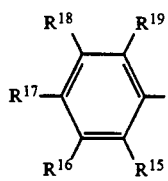

in which $R^{15}$ to $R^{19}$ are identical or different and each is a hydrogen atom, a halogen atom, an alkyl radical which has up to 6 carbon atoms and is unsubstituted or substituted by one or more halogen atoms, aryl or aryloxy radicals and in which individual methylene groups can be replaced by oxygen or sulfur atoms and in which in each case two of these radicals can be linked to form a 5- or 6-membered ring; a cycloalkyl radical having up to 8 carbon atoms, an alkenyl radical having up to 6 carbon atoms or an aryl or aryloxy radical having up to 10 carbon atoms, the total number of the carbon atoms in the radicals $R^{15}$ to $R^{19}$ being not more than 12.

6. A positive-working radiation-sensitive mixture as claimed in claim $R^7$ wherein is a naphthyl or heteroaryl radical having up to 10 carbon atoms, an alkylene radical having up to 6 carbon atoms or an arylene or heteroarylene radical having up to 14 carbon atoms.

7. A positive-working radiation-sensitive mixture as claimed in claim 1, wherein $R^2$, $R^3$, $R^4$, and $R^6$ are each a hydrogen atom, $R^5$ is a methyl group, $R^7$ is a methyl, ethyl, trifluoromethyl, 1,1,2,3,3,3-hexafluoropropyl, phenyl, tolyl, 4-fluorophenyl, 4-chlorophenyl, 4-bromophenyl or 4-nitrophenyl radical, m is 1, and n is 0 or 1.

8. A positive-working radiation-sensitive mixture as claimed in claim 1, wherein the content of a) is 0.5 to 25% by weight, relative to the total weight of the solids in the radiation-sensitive mixture.

9. A positive-working radiation-sensitive mixture as claimed in claim 1, comprising 1–60%; by weight of b), relative to the total weight of the solids in the mixture.

10. A positive-working radiation-sensitive mixture as claimed in claim 1, wherein the extinction of c) for radiation of wavelength from about 220 to 500 nm is less than 0.5.

11. A positive-working radiation-sensitive mixture as claimed in claim 1, wherein c) comprises a polymer which contains at least one phenolic hydroxy group.

12. A positive-working radiation-sensitive mixture as claimed in claim 1, wherein c) contains at most 30% by weight of a novolak condensation resin.

13. A positive-working radiation-sensitive mixture as claimed in claim 1, wherein the content of c) is 30% to 95%; by weight, relative to the total weight of the solids in the radiation-sensitive mixture.

14. A positive-working radiation-sensitive mixture as claimed in claim 1, wherein b) comprises a monomeric or oligomeric acetal, an ortho-ester derivative, or an N-O-acetal.

15. A positive-working radiation-sensitive mixture as claimed in claim wherein the 1-sulfonyloxy-2-pyridone has a higher molar absorption for radiation of the wavelength of about 220 to 500 nm than the remaining constituents of the mixture.

16. A positive-working radiation-sensitive recording material comprised of a support and a radiation-sensitive layer, wherein the layer comprises a radiation-sensitive mixture as claimed in claim 1.

17. A method for preparing a positive-working radiation-sensitive recording material as claimed in claim 16, which comprises applying said radiation-sensitive mixture to said support, or to a layer coated on said support.

18. A method as claimed in claim 17, comprising dissolving said mixture in a solvent, and applying the resulting solution to said support, and optionally, removing said solvent.

19. A method of preparing an image pattern comprising irradiating the radiation-sensitive layer of claim 16 imagewise, optionally heating said layer, treating the layer with a developer which removes the irradiated areas of the layer, and optionally post-hardening the developed layer structures.

20. A method as claimed in claim 17, which comprises first applying said radiation-sensitive layer to a temporary support, and then applying said support to said radiation-sensitive layer, and then optionally removing said temporary support.

* * * * *

UNITED STATES PATENT AND TRADEMARK OFFICE
CERTIFICATE OF CORRECTION

PATENT NO. : 5,229,254                                    Page 1 of 2
DATED      : July 20, 1993
INVENTOR(S): Gerhard LOHAUS, Walter SPIESS and Georg PAWLOWSKI It is certified that error appears in the above-indentified patent and that said Letters Patent is hereby corrected as shown below:

Column 4, line 14, insert the index --m-- of formula (I).

Column 5, line 53, place circle around "Het" of formula (III).

Column 34, line 44, (Claim 1, line 20), insert the index --m-- of formula (I).

Column 35, line 48, (Claim 3, line 6), place circle around "Het" of formula (III).

Column 36, line 3, (Claim 4, line 14), place circle around "Het" of formula (III).

UNITED STATES PATENT AND TRADEMARK OFFICE
CERTIFICATE OF CORRECTION

PATENT NO. : 5,229,254
DATED : July 20, 1993
INVENTOR(S) : Gerhard Lohaus, Walter Spiess, and Georg Pawlowski It is certified that error appears in the above-indentified patent and that said Letters Patent is hereby corrected as shown below:

Column 37, line 8, after "claimed in claim" insert --1--;

Column 37, line 8, delete "$R^7$ wherein" and insert --wherein $R^7$--;

Column 37, line 27, delete ";" after "1-60%".

Column 38, line 13, after "claimed in claim" insert --1--.

Signed and Sealed this

Thirty-first Day of May, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,229,254
DATED : July 20, 1993
INVENTOR(S) : Gerhard LOHAUS et al.

It is certified that error appears in the above-indentified patent and that said Letters Patent is hereby corrected as shown below:

Column 35, lines 21 and 22, (Claim 2, line 16), delete "cycloalkylthioorcycloalkanesulfonyl" and insert --cycloalkylthio or cycloalkanesulfonyl--.

Column 36, lines 13 and 14, (Claim 4, line 24), delete "cycloalkylthioorcycloalkanesulfonyl" and insert --cycloalkylthio or cycloalkanesulfonyl--.

Signed and Sealed this

Twentieth Day of September, 1994

Attest:

BRUCE LEHMAN

*Attesting Officer*        *Commissioner of Patents and Trademarks*